(12) United States Patent
Aoki et al.

(10) Patent No.: US 7,348,244 B2
(45) Date of Patent: *Mar. 25, 2008

(54) METHOD OF PRODUCING A SEMICONDUCTOR DEVICE

(75) Inventors: Takaaki Aoki, Okazaki (JP); Yukio Tsuzuki, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 57 days.

This patent is subject to a terminal disclaimer.

(21) Appl. No.: 11/345,310

(22) Filed: Feb. 2, 2006

(65) Prior Publication Data

US 2006/0128100 A1    Jun. 15, 2006

Related U.S. Application Data

(62) Division of application No. 11/087,758, filed on Mar. 24, 2005, now Pat. No. 7,026,215, which is a division of application No. 10/635,490, filed on Aug. 7, 2003, now Pat. No. 7,126,187.

(30) Foreign Application Priority Data

Aug. 22, 2002    (JP)    ............................. 2002-241859

(51) Int. Cl.
*H01L 21/336*    (2006.01)
(52) U.S. Cl. ............... 438/270; 438/589; 257/E21.419; 257/E21.428
(58) Field of Classification Search ................ 438/270, 438/589, 591, 770, 259; 257/E21.384, E21.419, 257/E21.428, E29.201, E21.321
See application file for complete search history.

(56) References Cited

U.S. PATENT DOCUMENTS

| | | | |
|---|---|---|---|
| 5,610,422 A | 3/1997 | Yanagiya et al. | |
| 5,726,088 A | 3/1998 | Yanagiya et al. | |
| 6,057,558 A * | 5/2000 | Yamamoto et al. | ........... 257/77 |
| 6,274,905 B1 | 8/2001 | Mo | |
| 6,285,058 B1 | 9/2001 | Narazaki et al. | |
| 6,355,974 B1 * | 3/2002 | Lin et al. | ........... 257/622 |
| 6,469,345 B2 | 10/2002 | Aoki et al. | |
| 6,620,669 B2 | 9/2003 | Hijzen et al. | |
| 7,026,215 B2 * | 4/2006 | Aoki et al. | ........... 438/270 |
| 2002/0167046 A1 | 11/2002 | Aoki et al. | |

FOREIGN PATENT DOCUMENTS

| | | |
|---|---|---|
| JP | A-10-214968 | 8/1998 |
| JP | A-10-256545 | 9/1998 |

* cited by examiner

*Primary Examiner*—Quoc Hoang
(74) *Attorney, Agent, or Firm*—Posz Law Group, PLC

(57) ABSTRACT

A semiconductor device includes a semiconductor substrate, a cell region in a surface portion of the substrate for operating as a transistor, a gate lead wiring region having a gate lead pattern on the substrate, a trench in the surface portion of the substrate extending from the cell region to the gate lead wiring region, an oxide film on an inner surface of the trench, and a gate electrode in the trench insulated with at least the oxide film from the substrate. A speed of formation of a main portion of the sidewalls of the trench at the gate lead wiring region is greater than that of a main portion of the sidewalls of the trench at the cell region, so that a thickness of the oxide film at the gate lead wiring region is greater than that at the cell region.

4 Claims, 15 Drawing Sheets

METHOD OF PRODUCING A SEMICONDUCTOR DEVICE

CROSS REFERENCE TO RELATED APPLICATION

This application is a division of application Ser. No. 11/087,758 filed on Mar. 24, 2005, now U.S. Pat. No. 7,026,215 which is a division of application Ser. No. 10/635, 490 filed on Aug. 7, 2003, now U.S. Pat. No. 7,126,187 which is based on Japanese Patent Application No. 2002-241859 filed on Aug. 22, 2002, the disclosure of which is incorporated herein by reference.

FIELD OF THE INVENTION

The present invention relates to a semiconductor device and a method of producing the same, and particularly to a semiconductor device having a trench gate structure and a method of producing the same.

BACKGROUND OF THE INVENTION

According to a related art, some semiconductor devices have a trench gate structure to control a current flowing between a source and a drain thereof. These semiconductor devices as a trench gate type transistor have a structure shown in FIG. 25. Here, FIG. 25 shows a top view of a substrate 4 on arrow XXV-XXV in FIG. 26A for clarity, i.e., FIG. 25 shows the top view of the substrate 4 with removing a layer-to-layer insulation film 11 from the device. As shown in FIG. 25, the semiconductor device has a cell region 87 including transistors and a gate lead wiring region 88 where a gate lead wiring pattern 18 is formed.

At the cell region 87, a plurality of trench gates is arranged in a net pattern with mesh structure. Each mesh, i.e., the form of the trench gate in the plan view is a quadrangle. The trench gate includes a trench 105. The trench 105 is formed in a surface layer of a semiconductor substrate 4 having an N⁻ type of drift layer 2 and a P type base region 3, as shown in FIG. 26A. A gate oxide film 109 is formed to cover the inner wall of the trench 105, and a gate electrode 10 is formed in the trench with the gate oxide film 109. At both sides of the gate electrode 10, N⁺ type source regions 7 are formed in the surface layer of the semiconductor substrate 4, and a layer-to-layer insulation film 11 is formed on the gate electrode 10 and the N⁺ type source regions 7.

A plurality of trenches 114 extends from the cell region 87 to the gate lead wiring region 88, and terminates at a predetermined place in the gate lead wiring region 88. As shown in FIG. 26B, in the gate lead wiring region 88, a gate oxide film 115 is formed on the inner wall of the trench 114, and a gate electrode 16 is formed in the trench 114 with the gate oxide film 115.

The trench 114 is connected to one end of the trench 105 and extends perpendicularly from the end. For example, it is assumed that the semiconductor substrate 4 having a crystal plane of (001) of silicon (i.e., the (001) plane) is used. At the cell region 87, each side of the trench 105 is formed in a direction parallel to or perpendicular to a crystal axis <100> of silicon (i.e., the <100> axis). On the other hand, the trench 114 extends in a direction parallel to the <100> axis. That is, the sidewalls of both the trenches 105 and the trenches 114 are formed along the (100) plane and its equivalent planes such as a (010) plane, a ($\bar{1}$00) plane, and a (0$\bar{1}$0) plane (i.e., the sidewalls have the (100)-oriented planes).

A gate lead wiring pattern 18 is formed on the gate oxide film 115, so that the gate electrode 16 is covered with the gate lead wiring pattern 18. Therefore, the gate electrodes 10, 16 and the gate lead wiring pattern 18 are electrically connected. Moreover, the gate electrodes 10, 16 are electrically connected to gate metal wires (not shown) through the gate lead wiring pattern 18.

As shown in FIG. 26B, a corner 116 is formed on the top surface of the gate electrode 16, so that the intensity of the electric field applied to the gate oxide film 115 at the corner becomes larger than that at other places. Accordingly, in the P type base region 3 which acting as the channel region of the transistor, the electric field intensity at the region close to the corner becomes higher than other portion. Then, this region turns on at a lower potential applied to the gate electrode. Therefore, this electric field concentration reduces the reliability of the gate electrode.

To increase in the reliability of the gate electrode structure, there may be a method to make the gate oxide film 115 thicker. However, in the process of forming the gate oxide films 109, 115, the gate oxide films 109, 115 are formed by thermal oxidation, and generally, the thermal oxidation is effected to the cell region 87 and the gate lead wiring region 88 at the same time. Accordingly, the thickness of the gate oxide film 109 at the cell region 87 would be also increased in accordance with increasing the thickness of the gate oxide film 115 at the gate lead wiring region 88.

If the gate oxide film 109 has a thicker portion at the cell region 87, this would reduce the mutual conductance, i.e., a response in current with respect to the gate potential becomes lower. Accordingly, the ON-resistance of the transistor would increase.

SUMMARY OF THE INVENTION

In view of the above-mentioned problems, it is an object of the present invention to provide a superior semiconductor device having an improved reliability with suppression of increase in the ON-resistance from the desired value.

Another object of the present invention is to provide a superior method of producing a semiconductor device.

Still another object of the present invention is to provide a semiconductor device having a trench gate type transistor.

A semiconductor device includes a semiconductor substrate, a cell region in a surface portion of the substrate for operating as a transistor, a gate lead wiring region having a gate lead pattern on the substrate, a trench in the surface portion of the substrate extending from the cell region to the gate lead wiring region, an oxide film on an inner surface of the trench so as to have sidewalls and a bottom wall, and a gate electrode in the trench insulated with at least the oxide film from the substrate. The oxide film is provided by thermal oxidation of a portion of the substrate at a position corresponding thereto. A speed of formation of a main portion of the sidewalls of the trench at the gate lead wiring region is greater than that of a main portion of the sidewalls of the trench at the cell region. A thickness of the oxide film on the main portion of the sidewalls of the trench at the gate lead wiring region is greater than that at the cell region.

In the above device, concentration of electric field applied to the oxide film on the sidewalls at the gate lead wiring region is comparatively suppressed, i.e., the electric field intensity around a corner is suppressed to increase. Therefore, the reliability of the gate electrode is improved.

Moreover, since the oxide film on the sidewalls at the cell region is comparatively thin, mutual conductance, i.e., a response in current with respect to gate potential remains comparatively high. Accordingly, ON-resistance of a transistor is limited to increase.

Thus, the reliability of the gate electrode is improved with suppression of increase in ON-resistance of the transistor from the desired value.

Preferably, the semiconductor substrate includes a silicon substrate having a (100) crystal plane or its equivalent planes, the main portion of the sidewalls of the trench at the cell region includes the (100) crystal plane or its equivalent planes, and the main portion of the sidewalls of the trench at the gate lead wiring region includes a (110) crystal plane or its equivalent planes.

Preferably, the semiconductor substrate includes a silicon substrate having a (110) crystal plane or its equivalent planes, the main portion of the sidewalls of the trench at the cell region includes a (100) crystal plane or its equivalent plane, and the main portion of the sidewalls of the trench at the gate lead wiring region includes the (110) crystal plane or its equivalent planes.

Preferably, the semiconductor substrate includes a silicon substrate having a (110) crystal plane or its equivalent planes, the main portion of the sidewalls of the trench at the cell region includes a (100) crystal plane or its equivalent planes, and the main portion of the sidewalls of the trench at the gate lead wiring region includes a (111) crystal plane or its equivalent planes.

Preferably, the trench at the cell region provides a quadrangle cell, a hexagon cell, or an octagon cell as a first cell and a quadrangle cell as a second cell, and a plurality of cells is arranged on the surface of the substrate like a net pattern at the cell region.

Preferably, the trench at the cell region provides a plurality of quadrangle cells arranged on the surface of the substrate like a net pattern at the cell region, and all sidewalls of the trench in each cell includes the (100) crystal plane or its equivalent planes.

Preferably, the trench at the cell region provides a plurality of hexagon cells arranged on the surface of the substrate like a net pattern at the cell region, and four sidewalls of the trench in each cell includes the (100) crystal plane or its equivalent planes, and the remaining two sidewalls of the trench in each cell includes the (110) crystal plane or its equivalent planes. More preferably, each of the four sides of the hexagon cell is longer than each of the remaining two sides of the hexagon cell. Further preferably, the trench has a predetermined width on a surface of the substrate, and a length of each of the remaining two sides of the hexagon cell is substantially the same as the predetermined width.

Preferably, a plurality of trenches extends from the cell region to the gate lead wiring region in such a manner that each end of the trenches at the gate lead wiring region connects together.

Preferably, the trench at the cell region provides a plurality of hexagon cells arranged on the surface of the semiconductor substrate like a net pattern at the cell region, two sides of the hexagon cell extend along a <100> crystal axis, and the remaining four sides of the hexagon cell extend along a <111> crystal axis, and a total length of the two sides is equal to or greater than a total length of the remaining four sides.

Further, a semiconductor device includes a semiconductor substrate, a cell region in a surface portion of the substrate for operating as a transistor, a gate lead wiring region having a gate lead pattern on the substrate, a trench in the surface portion of the substrate extending from the cell region to the gate lead wiring region, an oxide film on an inner surface of the trench so as to have sidewalls and a bottom wall, and a gate electrode in the trench insulated with at least the oxide film from the substrate. A thickness of the oxide film on a main portion of the sidewalls of the trench at the gate lead wiring region is greater than that at the cell region. The main portion of the sidewalls of the trench at the cell region includes a first crystal plane or its equivalent planes. The main portion of the sidewalls of the trench at the gate lead wiring region includes a second crystal plane or its equivalent planes. A speed of formation of the oxide film on the first crystal plane is greater than that on the second crystal plane.

In the above device, concentration of electric field applied to the oxide film on the sidewalls at the gate lead wiring region is comparatively suppressed, so that the reliability of the gate electrode is improved. Moreover, since the oxide film on the sidewalls at the cell region is comparatively thin, mutual conductance remains comparatively high. Accordingly, ON-resistance of a transistor is limited to increase. Thus, the reliability of the gate electrode is improved with suppression of increase in ON-resistance of the transistor from the desired value.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
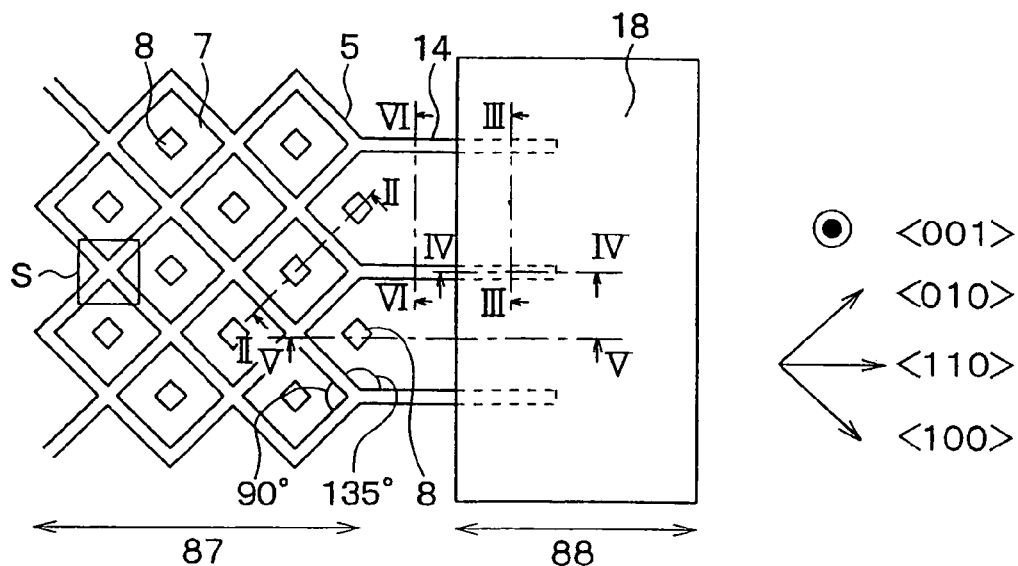
FIG. 1 is a plan view of a semiconductor device according to the first embodiment of the present invention, the plan view showing a top view of a substrate on arrow I-I in FIG. 2 for clarity.
Figure 2:
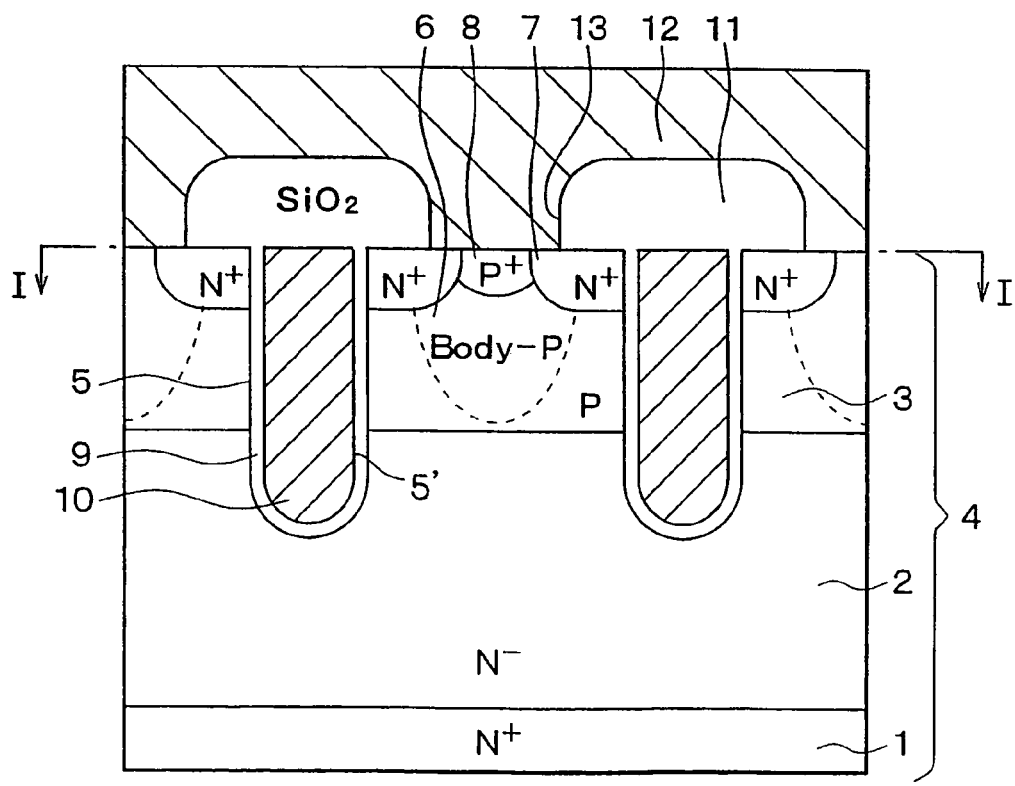
FIG. 2 is a cross-sectional view taken along line II-II in FIG. 1.

As shown in FIGS. 1 and 2, a semiconductor device according to the first embodiment of the present invention includes a diffused metal-oxide semiconductor i.e., DMOS. Here, FIG. 1 shows a top view of a substrate 4 on arrow I-I in FIG. 2 for clarity, i.e., FIG. 1 shows the top view of the substrate 4 with removing a layer-to-layer insulation film 11 and a metal electrode 12 from the device. Following plan view in each drawing also shows a top view of a substrate, similar to FIG. 1. This semiconductor device includes a semiconductor substrate 4 having an N$^+$ type substrate 1, an N$^-$ type drift layer 2 on the N$^+$ type substrate 1, P type base region 3 on the N$^-$ type drift layer 2. The substrate 4 is made of silicon. An impurity diffusion concentration of the N$^+$ type substrate 1 is, for example, $1\times10^{19}$ cm$^{-3}$, that of the N$^-$ type drift layer 2 is, for example, $1\times10^{16}$ cm$^{-3}$, and that of the P type base region 3 is, for example, $1\times10^{18}$ cm$^{-3}$.

The semiconductor device has a cell region 87 operating as a transistor and a gate lead wiring region 88 where a gate lead wiring pattern 18 is formed. At the cell region 87, a plurality of trench gates is arranged in a net pattern with mesh structure, and is formed in a surface layer of the semiconductor substrate 4. Each mesh, i.e., the form of the trench gate in the plan view is a quadrangle.

Specifically, the mesh of the trench gate of the semiconductor substrate 4 has a square (or diamond) shape as a unit cell including sidewalls of the trench 5 extending parallel to a crystal axis <100> of the semiconductor substrate 4 (i.e., the <100> axis) and sidewalls extending perpendicularly to the <100> axis. These unit cells are recurrently arranged like a net pattern. Therefore, all the sidewalls of the trench 5 are composed of a (100) plane of the semiconductor substrate 4 and its equivalent planes such as a (010) plane, a ($\bar{1}$00) plane, and a (0$\bar{1}$0) plane (i.e., all the sidewalls have the (100)-oriented planes).

As shown in FIG. 2, each cell includes a P type body region 6, an N$^+$ type source region 7, and a P$^+$ type contact region 8. An impurity concentration of the P type body region 6 is $5\times10^{18}$ cm$^{-3}$, that of the N$^+$ type source region 7 is $5\times10^{19}$ cm$^{-3}$, and that of the P$^+$ type contact region 8 is $5\times10^{19}$ cm$^{-3}$. However, another impurity concentration of each region 6-8 can be used.

A depth of the trench 5 is between 1 μm and 3 μm from the surface of the substrate 4. A gate oxide film 9 having a thickness of 60 nm is formed on the inner wall of the trench 5. A gate electrode 10 made of polycrystalline silicon is formed in the trench 5 with the gate oxide film 9. In other words, the gate oxide film 9 has a gutter form, and the gate electrode 10 is formed in the gutter form. A layer-to-layer insulation film 11 made of BPSG (i.e., boro-phosphosilicate) is formed on the surface of the substrate 4.

A metal electrode 12 made of Al is formed on the layer-to-layer insulation film 11. Moreover, the layer-to-layer insulation film 11 has a contact hole 13, so that the metal electrode 12 is electrically connected to the N$^+$ type source region 7 and to the P$^+$ type contact region 8 through the contact hole 13.

At the gate lead wiring region 88, a plurality of trenches 14 extend straightly from cells along a <110> axis, respectively. In other words, sidewalls of each trench 14 are formed to have the (110) plane and its equivalent planes such as a ($\bar{1}\bar{1}$0) plane, a ($\bar{1}$10) plane, and a (1$\bar{1}$0) plane (i.e., the sidewalls have the (110)-oriented planes). Thus, the trench 14 is connected to the trench 5 at an angle of 135°.

Figure 3:
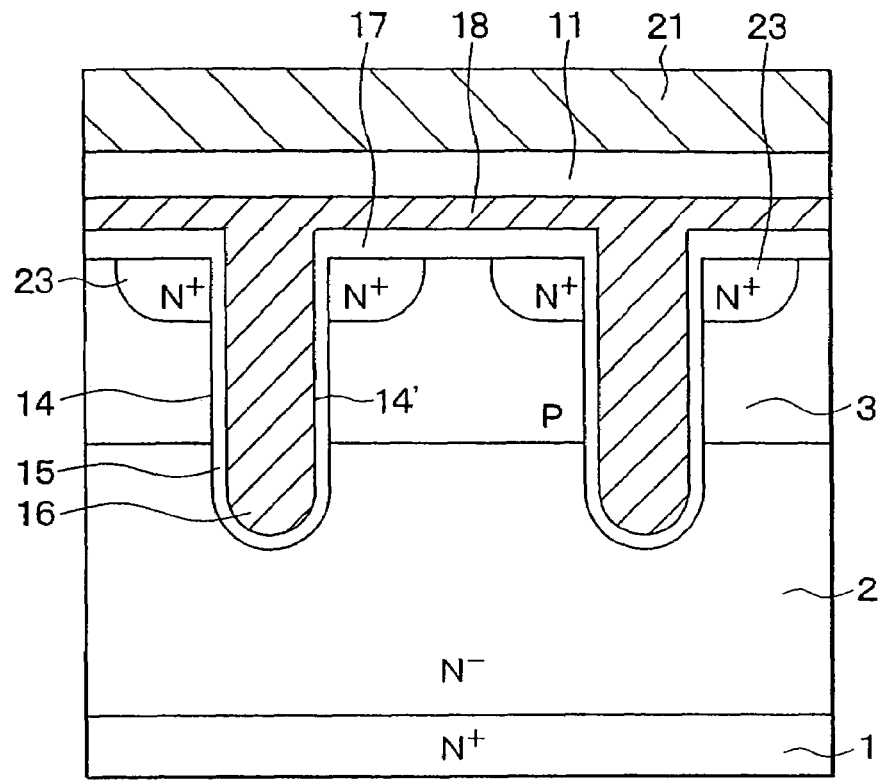
FIG. 3 is a cross-sectional view taken along line III-III in FIG. 1.

As shown in FIG. 3, the trench 14 is formed in the surface layer of the semiconductor substrate 4 with a depth of 1 μm to 3 μm from the surface of the semiconductor substrate 4.

A gate oxide film 15 is formed on the inner walls of the trench 14, and has a thickness of 80 nm to 100 nm, which is thicker than that of the gate oxide film 9 at the cell region 87. A polycrystalline silicon gate electrode 16 is formed in the trench 14 with the gate oxide film 15. In other words, the gate oxide film 15 have a gutter form, and the polycrystalline silicon gate electrode 16 is formed in the gutter form.

At the gate lead wiring region 88, an oxide film 20 is formed on the semiconductor substrate 4 except the trench 14. A gate lead wiring pattern 18 is formed on the oxide film 17 and on the trench 14, so that the gate lead wiring pattern 18 connects to the gate electrode 16. The gate lead wiring pattern 18 is made of polycrystalline silicon.

Figure 4:
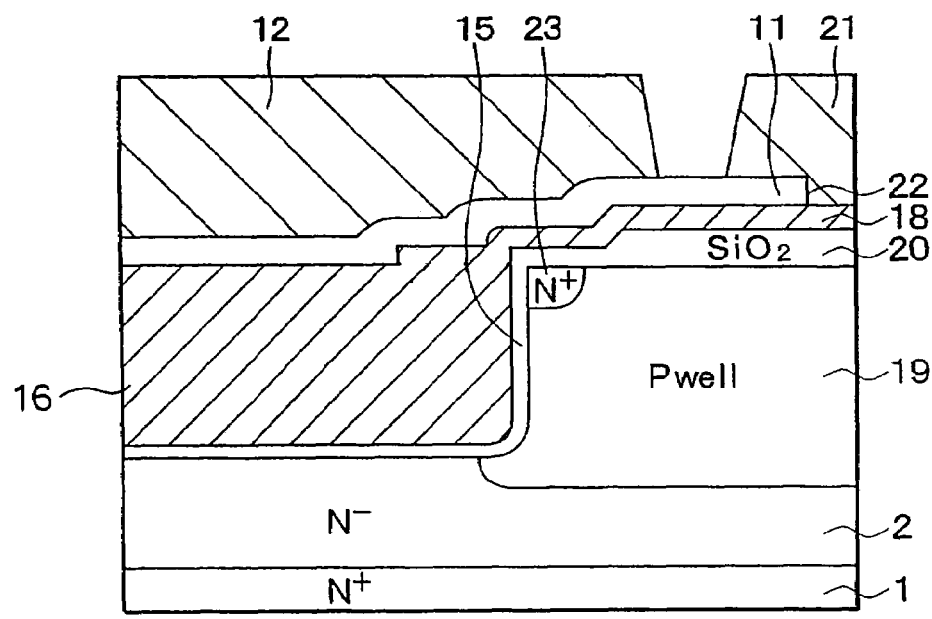
FIG. 4 is a cross-sectional view taken along line IV-IV in FIG. 1.

As shown in FIG. 4, at the gate lead wiring region 88, a P type well layer 19 is formed on the N$^-$ type drift layer 2 so that the P type well layer 19 connects to the P type base region 3. The impurity concentration of the P type well layer 19 is $2\times10^{16}$ cm$^{-3}$. An oxide film 20 is formed on the P type well layer 19. The gate lead wiring pattern 18 is formed on the oxide film 20.

The layer-to-layer insulation film 11 is formed on the gate lead wiring pattern 18, so that the layer-to-layer insulation film 11 extends from the cell region 87. A gate electrode wiring 21 made of Al is formed on the layer-to-layer insulation film 11. The gate electrode wiring 21 is electrically connected to the gate lead wiring pattern 18 through a contact hole 22 formed in the layer-to-layer insulation film 11.

At the gate lead wiring region 88, N$^+$ type layers 23 are formed in a surface layer of the P type base region 3 on both sides of each trench 14. The impurity concentration of the N$^+$ type layers 23 is $5\times10^{19}$ cm$^{-3}$.

Figure 5:
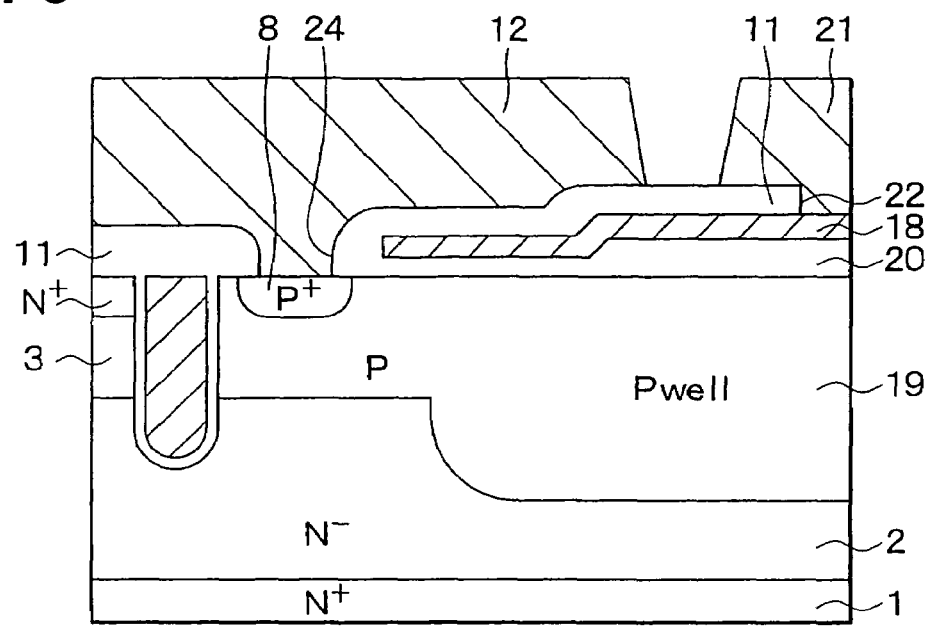
FIG. 5 is a cross-sectional view taken along line V-V in FIG. 1.
Figure 6:
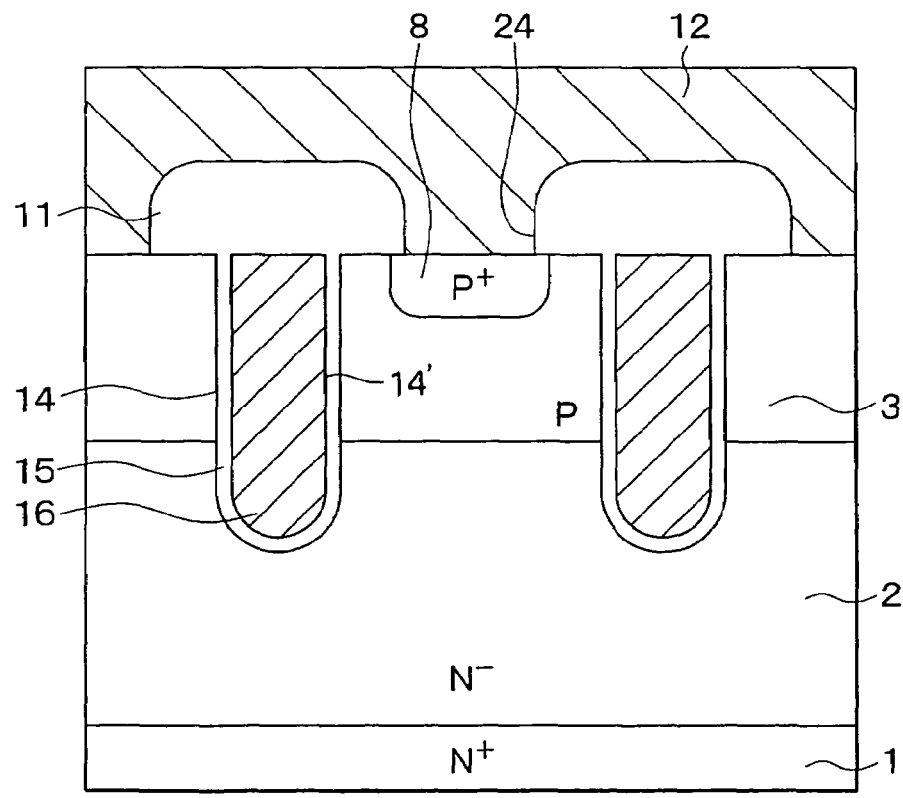
FIG. 6 is a cross-sectional view taken along line VI-VI in FIG. 1.

As shown in FIGS. 5 and 6, P$^+$ type contact regions 8 are also formed at the region between the cell region 87 and the gate lead wiring region 88. Because this region does not operate as transistor cells, the P type body region 6 and the N$^+$ type source region 7 are not formed at this region, unlike at the cell region 87. However, they can be formed there. The P$^+$ type contact region 8 is electrically connected to the metal electrode 12 through a contact hole 24 formed in the layer-to-layer insulation film 11, similar to the cell region 87.

In this semiconductor device, when the gate electrodes 10, 16 is applied with a gate potential and the transistor cell is turned on, a portion of the P type base region 3 becomes a channel region. Therefore, a current flows between source (i.e., the metal electrode 12) and drain (i.e., a drain electrode, not shown) of the transistor.

Here, the gate oxide film 9 formed on the inner wall of trenches 5 at the cell region 87 has a predetermined thickness, which is comparatively thin so as to provide a desired ON-resistance (i.e., a low ON-resistance). On the other hand, the gate oxide film 15 at the gate lead wiring region 88 has a thickness, which is thicker than that of the gate oxide film 9.

Thus, the ON-resistance is comparably low even though the gate oxide film 15 is thicker than the gate oxide film 9, so that the gate reliability of this semiconductor device is improved.

A method of producing the semiconductor device will be described as follows.

At first, the N$^-$ type drift layer 2 is formed on the N$^+$ type semiconductor substrate 1 made of silicon with the (100) plane by the epitaxial growth method. Next, a portion of N$^-$ type drift layer 2 is processed from the cell-to-be-formed region into the gate-lead-wiring-to-be-formed region to have the P type base region 3 operative as a channel region. In addition, at the gate-lead-wiring-to-be-formed region, the P type well region 19 is formed.

Next, the P type body regions 6 are formed in the P type base region 3 at the cell-to-be-formed region. Further, the N$^+$ source regions 7 are formed in the surface layer of the P type base region 3, and the N$^+$ type layers 23 are formed in the surface layer of the P type base region 3 at the gate-lead-wiring-to-be-formed region. Further, the P$^+$ type contact regions 8 are formed at the cell-to-be-formed region and between the cell-to-be-formed region and the gate-lead-wiring-to-be-formed region.

Next, an oxide film 17 which will work as a mask on forming the trenches is deposited by the CVD (i.e., chemical vapor deposition) method. Then, in the photolithography and dry etching processes, a portion of the oxide film 17 is selectively removed at the cell-to-be-formed region and the gate-lead-wiring-to-be-formed region.

In these processes, the oxide film 17 is formed so as to form the initial trench 5' having a quadrangle pattern at each mesh at the cell-to-be-formed region, and to form the initial trench 14' having a stripe pattern at the gate-lead-wiring-to-be-formed region. Further, in these processes, the oxide film 17 is patterned such that the initial trench 5' at the cell-to-be-formed region extends in the direction of crystal axes <100> or <010>, and the trenches 14 at the gate-lead-wiring-to-be-formed region extend in the direction of the <110> axis.

In other words, the sidewalls of the initial trench 5' at the cell-to-be-formed region are composed of the (100)-oriented planes. Accordingly, the trench gate is provided to have the mesh structure of a quadrangle with internal angles of 90°.

At the gate-lead-wiring-to-be-formed region, the oxide film 17 is formed to have straight lines extending parallel to the <110> axis. Each of the straight lines extends from the quadrant mesh at the cell-to-be-formed region to make angles 135° with sides of the quadrant mesh.

Next, the surface of the semiconductor substrate 4 with the oxide film 17 as a mask is dry-etched, so that the initial trenches 5', 14' are formed. The sidewalls of the initial trenches 5' at the cell-to-be-formed region are composed of the (100)-oriented planes. At the gate-lead-wiring-to-be-formed region, the sidewalls of the initial trenches 14' are composed of the (110)-oriented planes.

Next, in the processes of chemical dry etching, sacrifice oxidation and the like, damages on surfaces of the initial trenches 5' and 14' are removed, and corners at the initial trenches 5' and 14' are rounded.

In the subsequent thermal oxidation process, the gate oxide films 9, 15 are formed on the surfaces of the initial trenches 5', 14', so that the trenches (i.e., the final trenches) 5, 14 are formed. At that time, each trenches 5, 14 has sidewalls and a bottom wall of the oxide film. The thickness of the gate oxide film 15 on the sidewalls of the trench 14 formed at the gate-lead-wiring-to-be-formed region is thicker than the thickness of the gate oxide film 9 on the sidewalls of the trench (i.e., the final trench) 5 at the cell-to-be-formed region. This is because a speed of oxidation depends on a crystal plane orientation. In the silicon substrate 4, the speed of oxidation at the (110)-oriented planes is greater than that at the (100)-oriented planes.

The thermal oxidation is performed within a temperature range between about 850° C. and about 1000° C., which is a relatively low temperature. The inventors confirmed through experiments conducted by the inventors that the crystal plane orientation dependency in the speed of oxidation was remarkably shown when the thermal oxidation was performed in this temperature range.

Here, at the gate-lead-wiring-to-be-formed region, the N$^+$ type layers 23 are previously formed in the surface layer of the P type base region 3, neighboring the trenches 14. In the thermal oxidation process, this structure makes a portion of the gate oxide film 15 neighboring the N$^+$ layers 23 thicker than the other portion of the gate oxide film 15 not neighboring the N$^+$ layers 23.

Similarly, a portion of the oxide film 17 on the N$^+$ layers 23 becomes thicker than the other portion of the oxide film 17 not covering the N$^+$ layers 23 in the thermal oxidation process. This is because during the thermal oxidation of a silicon substrate, a speed of thermal oxidation at a region having a relative higher impurity concentration is greater than that at a region having a relative lower impurity concentration.

The oxide film 20 is formed on the surface of the semiconductor substrate 4 at the gate-lead-wiring-to-be-formed region by the LOCOS (i.e., the local oxidation of silicon) method.

Next, a polycrystalline silicon film for the gate electrodes is deposited on the semiconductor substrate 4 including the inner surfaces of the gate insulation films 9, 15 on the trenches 5, 14 by the CVD method. In other words, the polycrystalline silicon film is deposited on the gate oxide films 9, 15. The polycrystalline silicon film is patterned to be left only in the trench 5 at the cell-to-be-formed region and to be left at the surface of the semiconductor substrate 4 at the gate-lead-wiring-to-be-formed region.

Thus, the gate electrode 10 is formed in the trench 5 at the cell-to-be-formed region. At the gate-lead-wiring-to-be-formed region, the gate electrodes 16 are formed in the trenches 14, and the gate lead wiring pattern 18 is formed so as to electrically connect to the gate electrode 16.

In the following process, the layer-to-layer insulation film 11 is formed on the semiconductor substrate 4. Then, the contact holes 13, 24 are formed at the cell-to-be-formed region and at the region between the cell-to-be-formed region and the gate-lead-wiring-to-be-formed region in the layer-to-layer insulation film 11. Further, the contact holes 22 are formed in the layer-to-layer insulation film 11 at the gate-lead-wiring-to-be-formed region.

Next, the metal electrode 12 operative as the source electrode is formed on the layer-to-layer insulation film 11 at the cell-to-be-formed region, the gate-lead-wiring-to-be-formed region, and the region therebetween. Further, the gate electrode wiring 21 is formed at the gate-lead-wiring-to-be-formed region on the layer-to-layer insulation film 11. As a result, the semiconductor device is accomplished.

In this embodiment, the surface of the silicon substrate 4 has the (001) plane, and the trench 5 is formed along the (100)-oriented planes at the cell region 87. On the other hand, at the gate lead wiring region 88, the trenches 14 are formed along the (110)-oriented planes. Further, the surfaces of the initial trenches 5', 14' are thermally oxidized under a condition, which provides an efficient crystal plane orientation dependency in oxidation speed.

Thus, the gate oxide film 15 at the gate lead wiring region 88 becomes thicker than the gate oxide film 9 at the cell region 87. In other words, when the thermal oxidation is performed at both the cell region 87 and the gate lead wiring region 88 at the same time, only the gate oxide films 15 at the gate lead wiring region 88 can be made thicker than the gate oxide film 9 at the cell region 87.

Accordingly, the concentration of the electric field applied to the gate oxide film 15 at the gate lead wiring region 88 is comparatively suppressed, i.e., the electric field intensity around a corner formed on the top surface of the gate electrode 16 is suppressed to increase. Therefore, the reliability of the gate electrode 16 is improved.

Moreover, since the gate oxide film 9 at the cell region 87 is comparatively thin, the mutual conductance, i.e., a response in current with respect to the gate potential remains comparatively high. Accordingly, the ON-resistance of the transistor is limited to increase.

Thus, the reliability of the gate electrode is improved with suppression of increase in ON-resistance of the transistor from the desired value.

Moreover, the $N^+$ type layers 23 are formed in the surface layer of the semiconductor substrate 4 at the gate lead wiring region 88 at the same time as the $N^+$ type source regions 7 are formed. Therefore, the portion of the gate oxide film 15, which contacts the $N^+$ type layers 23, becomes thicker than the other portion. A portion of the oxide film 17, which is formed on the $N^+$ type layer 23 at the same time as the gate oxide film 15, becomes thicker than the other portion.

Thus, the oxide films 17 at the upper corner portion of the trench 14 become thicker than the case where the $N^+$ type layer 23 would not be formed. Therefore, the gate reliability is also improved.

Although the trench 5 is formed at the cell region 87 in such a manner that each mesh of the trench 5 has a quadrant shape and all sidewalls of the trench 5 are composed of the (100)-oriented planes, it is possible that not all of sidewalls are composed of the (100)-oriented planes, i.e., only a main portion of sidewalls can be formed to have the (100)-oriented planes.

Figure 9A:
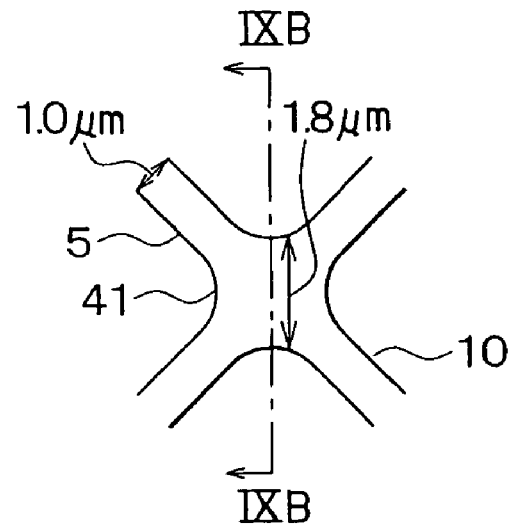
FIG. 9A is a partial enlarged plan view of a portion S in FIG. 1.

Further, a corner 41 of an intersection at the cell region is rounded, as shown in FIG. 9A. When a gate potential is applied, electric field intensity at the corner 41 is greater than other portions. Accordingly, in the P type base region 3 which working as the channel region of the transistor, the electric field intensity at the region close to the corner 41 becomes higher than other portions. Therefore, this region turns on at a lower potential applied to the gate electrode. Thus, the device having the quadrant cells may reduce the reliability.

To improve this reduction, the corner 41 at a cell is rounded. For example, the corner 41 of the intersection is rounded. Here, at the intersection, two trenches 5 intersect each other in the case that each mesh at the cell region 87 is a quadrant. Thus, four corners 41 are rounded with a radius of 0.5 μm. In this structure, the corners 41 shift outside from the center of the intersection portion in comparison with the case that the corner 41 is sharpened, so that the effective trench width at the intersection substantially increases. For example, assuming that the trench width is 1 μm and the radius at the corner 41 is 0.5 μm, the effective trench width at the intersection portion becomes 1.8 μm. Therefore, the electric field intensity around the corner 41 is limited to increase, so that the reliability of the device can be improved.

Second Embodiment

Figure 7:
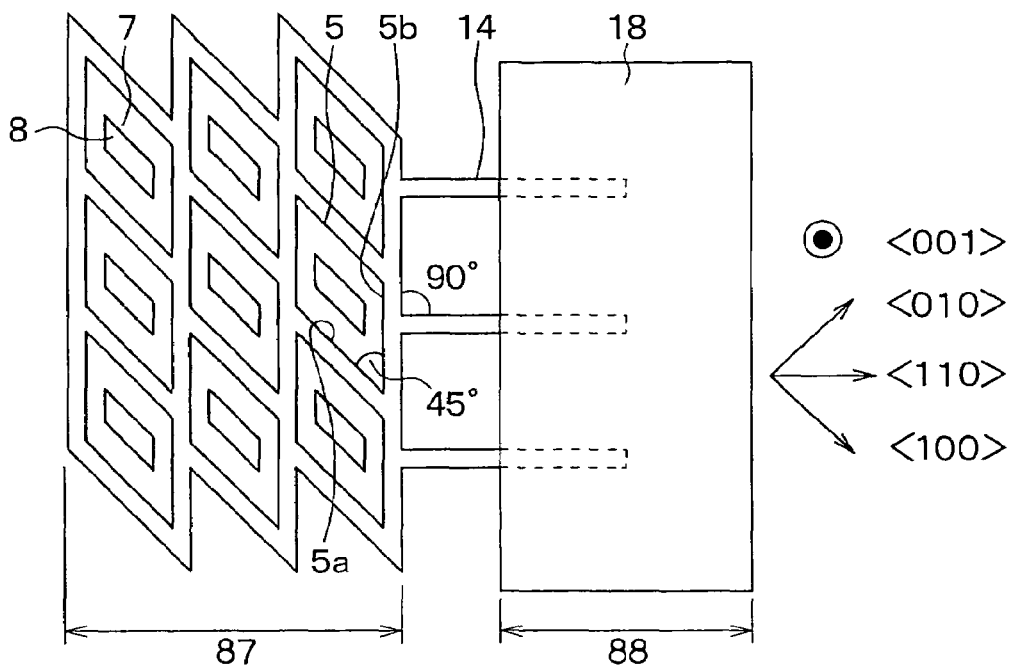
FIG. 7 is a plan view of a semiconductor device according to the second embodiment of the present invention, the plan view showing a top view of a substrate for clarity.

A semiconductor device according to the second embodiment has the cell region 87 and the gate lead wiring region 88, as shown in FIG. 7. The trench 14 extends from the cell region 87 to the gate lead wiring region 88. Each mesh has a parallelogram having trench sides 5a extending parallel to the <100> axis and trench sides 5b extending perpendicularly to the <110> axis, i.e., extending parallel to the <$\overline{1}$10> axis. Here, the trench sides 5a, 5b show a top view of the sidewalls of the trench 5.

At the cell region 87, a pair of sidewalls of the trench 5 are composed of the (010) and (0$\overline{1}$0) planes, the sidewalls including the trench sides 5a (i.e., the sidewalls of the trench sides 5a have the (010)-oriented planes). Another pair of sidewalls of the trench 5 are composed of the (110) and ($\overline{1}$$\overline{1}$0) planes, the sidewalls including the trench sides 5b (i.e., the sidewalls of the trench sides 5b have the (110)-oriented planes). At the gate lead wiring region 88, the sidewalls of the trench 14 are composed of the ($\overline{1}$10) and (1$\overline{1}$0) planes. The length of the trench side 5a is equal to that of the trench side 5b.

Therefore, during the thermal oxidation under the preferable condition, the gate oxide film 9 on the sidewalls including trench sides 5b becomes thicker than that on the sidewalls including trench sides 5a. The thickness of the gate oxide film 9 on the sidewalls including trench sides 5b is almost equal to that of the gate oxide film 15 at the gate lead wiring region 88. Although a half of the gate oxide film 9 becomes thick, residual half of the gate oxide film 9 becomes thinner than the gate oxide film 15. Therefore, the reliability of the gate is improved with suppression of increase in ON-resistance from the desired value.

In this embodiment, the sidewalls including trench side 5b are composed of the (110) and ($\overline{1}\overline{1}0$) planes, which is equivalent to the ($\overline{1}10$) and ($1\overline{1}0$) planes composing the sidewalls of the trench 14. Thus, the thickness of the gate oxide film 9 on the sidewalls including trench side 5b is almost the same as that of the gate oxide film 15 at the gate lead wiring region 88, so that the ON-resistance of the trench sides 5b is slightly higher than that of the trench sides 5a in accordance with increasing the threshold voltage. Therefore, it is desirable to shorten the trench side 5b rather than the trench side 5a, so that the ON-resistance of the transistor is limited to increase.

Preferably, to reduce the ON-resistance of the transistor, it is desirable to form a half or more of all sidewalls of the trench 5 to be composed of the (100)-oriented planes. In other words, it is preferred that a portion (main portion) of trench sides at each mesh composed of the (100)-oriented planes is formed in such a manner that the main portion becomes a half and more than half of the total length of trench sides.

Although each mesh has the quadrant form, each mesh can have another form such as polygons. A main portion of trenches in the polygons becomes a half and more than half of the total length of trench sides.

Third Embodiment

Figure 8:
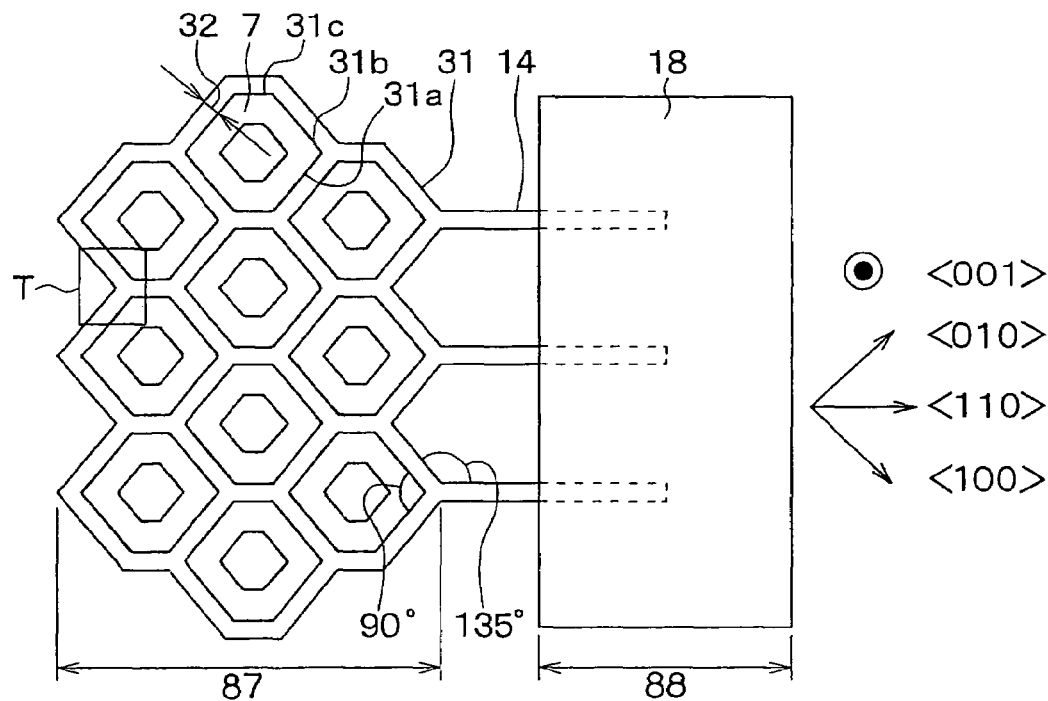
FIG. 8 is a plan view of a semiconductor device according to the third embodiment of the present invention, the plan view showing a top view of a substrate for clarity.

As shown in FIG. 8, a semiconductor device according to the third embodiment has the cell having a hexagon mesh.

At the cell region 87, each cell has a hexagon mesh including trench sides 31a extending parallel to the <010> axis, trench sides 31b extending parallel to the <100> axis, and trench sides 31c extending parallel to the <110> axis. Therefore, the trench sides 31c are parallel to the trench 14 at the gate lead wiring region 88.

The trench side 31a intersects with the trench side 31b at an angle of 90°, and the trench side 31c intersects with the trench side 31a, 31b at an angle of 135°. A width 32 of the trench 31 is in a range between 0.5 μm and 1.0 μm. The length of the trench side 31c on the surface of the semiconductor substrate 4 is in a range between 0.5 μm and 1.0 μm, which is substantially the same as the width 32 of the trench 31.

The trench 14 formed at the gate lead wiring region intersects with the trench side 31a, 31b at the cell region 87 at an angle of 135° and extends from the cell region 87.

On the inner walls of these trenches 31, 14, the gate oxide films 9, 15 are formed, and the gate electrodes 10, 16 are further formed on the gate oxide films 9, 15 in the trenches 31, 14.

The gate oxide film 15 formed at the gate lead wiring region 88 has a thickness thicker than the gate oxide film 9 formed on the sidewalls including trench sides 31a and on the sidewalls including trench sides 31b that are composed of the (100), ($\overline{1}00$), (010), and ($0\overline{1}0$) planes, i.e., the (100)-oriented planes.

Thus, the gate reliability of the semiconductor device is improved with suppression of increase in ON-resistance of the transistor from the desired value.

In this embodiment, the trench side 31c extends parallel to the <110> axis at the cell region 87, and the length of the trench side 31c is made shorter than that of the other trench sides 31a and 31b to suppress the ON-resistance. For example, the length of the trench side 31c is about the width 32 of the trench 31.

Each mesh is an irregular hexagon. It is assumed that the mesh is a regular hexagon, and the trench sidewalls are formed to have the (100)-oriented planes. Since each interior angle of the regular hexagon is 120°, only two opposite sides can be the (100)-oriented planes. The remaining four sidewalls become to have the (230)-oriented planes, i.e., the (230), ($\overline{2}30$), ($2\overline{3}0$), and ($\overline{2}\overline{3}0$) planes.

On the other hand, when the mesh is the irregular hexagon, four sidewalls are the (100)-oriented planes. Moreover, the trench side 31c being parallel to the <110> axis become shorter than the trench sides 31a and 31b being parallel to the <010> and <100> axes, respectively. Accordingly, the semiconductor device having this mesh structure can be more limited to increase the ON-resistance than the case that the mesh structure would have regular hexagons.

Moreover, since the mesh structure has the hexagon mesh at the cell region 87, the failure of forming polycrystalline silicon in the trench 31 as the gate electrode 10 can be limited as follows.

A corner of an intersection of the trench 5 at the cell region 87 is rounded. For example, the semiconductor device in FIG. 1 has a rounded corner 41, as shown in FIG. 9A. It is assumed that four corners 41 are sharpened and not rounded, the electric field intensity at the corner 41 becomes larger than other portions, so that the reliability of the gate electrode is reduced. Therefore, each corner 41 is rounded so that the electric field intensity around the corner 41 is limited to increase. This rounding of the corner 41 is also performed in other semiconductor devices such as the semiconductor device in FIG. 1.

Figure 9B:
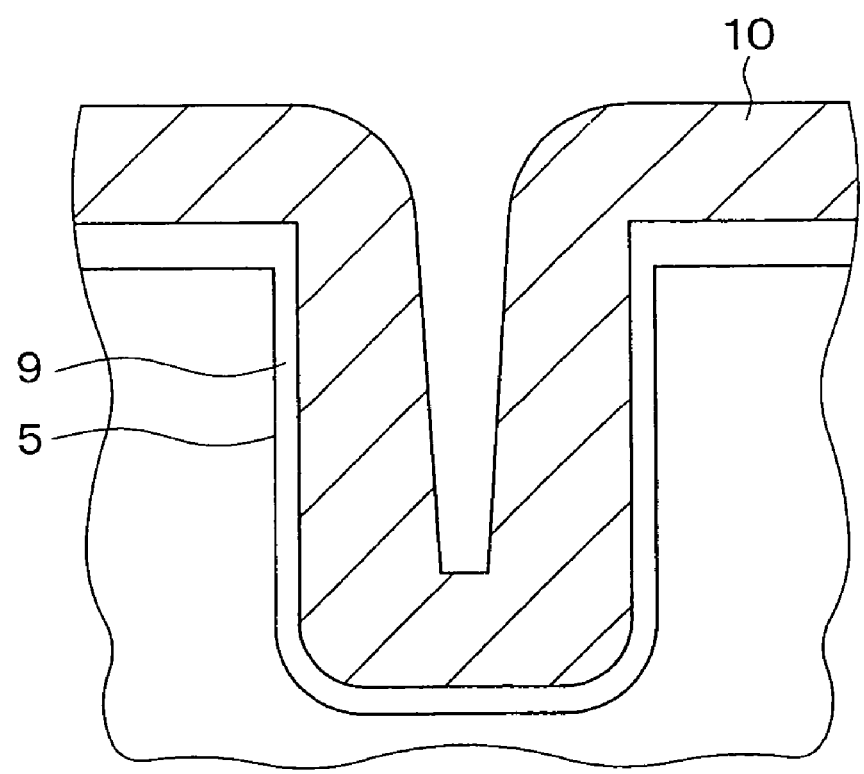
FIG. 9B is a partial enlarged cross-sectional view taken along line IXB-IXB in FIG. 9A.

In this case, when the polycrystalline silicon is formed in the trench as the gate electrode 10 in a silicon deposition process, a failure to form the polycrystalline silicon may occur. For example, as shown in FIG. 9B, the gate electrode 10 around the intersection may have a concavity. In other words, deposition of polycrystalline silicon for forming the gate electrode 10 cannot fully fill the trench 5. Here, for example, four corners are rounded with a radius of 0.5 μm in FIG. 9A. In this structure, the corners externally shift from the center of the intersection portion. That is, the effective width thereat increases. For example, assuming that the trench width is 1 μm and the radius at the corner is 0.5 μm, the effective trench width at the intersection portion becomes 1.8 μm. Therefore, on forming polycrystalline silicon in the trench as the gate electrode, an error may occur.

Then, impurity may enter the not-filled portion, i.e., the concavity, at the post process for manufacturing the semiconductor device. If the thickness of polycrystalline silicon is increased to fully full the trench 5, the manufacturing cost will increase.

Figure 10A:
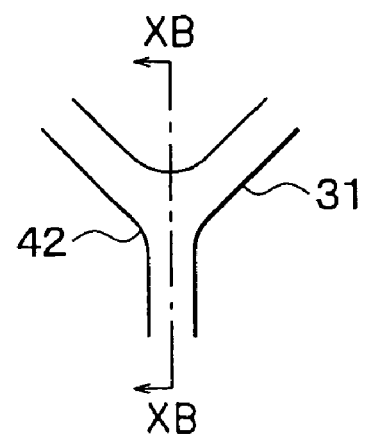
FIG. 10A is a partial enlarged plan view of a portion T in FIG. 8.
Figure 10B:
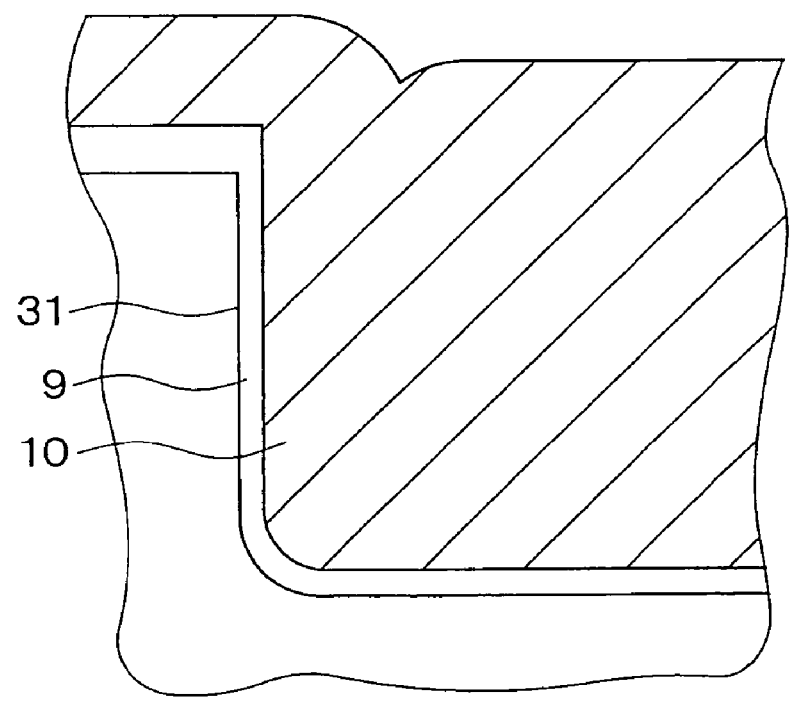
FIG. 10B is a partial enlarged cross-sectional view taken along line XB-XB in FIG. 10A.

On the other hand, according to this embodiment, the mesh has a hexagon, so that three trenches are connected each other at the intersection, as shown in FIGS. 10A and 10B. Even when the corner 42 is rounded, increase in the trench width at the intersection can be more suppressed than the case of the quadrant (diamond) mesh. This structure allows polycrystalline silicon to fully fill in the trench 31 without increasing the film thickness of the polycrystalline silicon.

Thus, the cell having a hexagon mesh suppresses the failure of forming the gate electrode 10 in comparison of the case using the cell having a quadrangle mesh. As a result, the yield of manufacturing the semiconductor device according to this embodiment becomes higher than that having the quadrant mesh structure.

Moreover, it is preferred that the length of the trench side 31c is as short as possible to reduce the ON-resistance of the transistor. Further, it is sufficient that the length of the trench side 31c is equal to or longer than the trench width 32 because this configuration is provided to intersect three trenches 31. In other words, the length of the trench side 31c is not necessitated to become wider so as to intersect four trenches 31.

Fourth Embodiment

Although each cell in the cell region 87 has a hexagon mesh, as shown in FIG. 8, other polygons such as an octagon can provide three trenches connected each other at an intersection.

Figure 11:
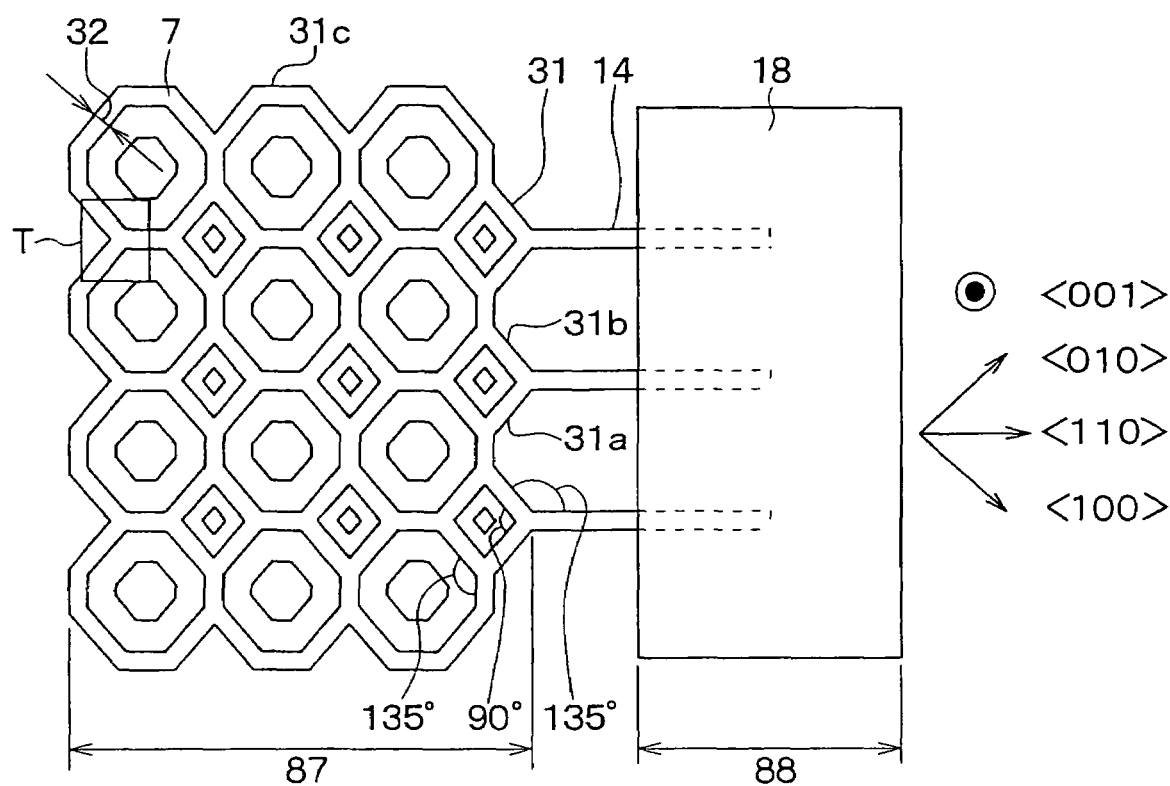
FIG. 11 is a plan view of a semiconductor device according to the fourth embodiment of the present invention, the plan view showing a top view of a substrate for clarity.

As shown in FIG. 11, a semiconductor device according to the fourth embodiment has an octagon mesh at the cell region 87. Specifically, cells of octagon mesh are arranged on the surface of the semiconductor substrate 4 at a regular interval two-dimensionally and meshes of diamond mesh similarly arranged two-dimensionally. Each diamond is surrounded by four octagons and each octagons is surrounded by four diamonds. That is, each octagon and each quadrangle are alternately arranged. In each octagon, the trench side 31a extending parallel to the <010> axis and the trench side 31b extending perpendicularly to the <010> axis, i.e., extending parallel to the <010> axis, are connected each other. Adding a trench 33 extending perpendicularly to the <110> axis between trench sides 31a and 31b provides the octagon.

The trench 33 has sidewalls with the (110) or ($\bar{1}\bar{1}0$) planes, which are equivalent to the ($1\bar{1}0$) and ($\bar{1}10$) planes composing the sidewalls including trench side 31c, and the length of the trench 33 is the same as that of the trench side 31c.

In the semiconductor device shown in FIG. 11, the trench sides 31a, 31b, 31c, and the trench 33 form the cell having the octagon mesh. Moreover, two trench sides 31a, 31b form the cell having a quadrant (diamond) mesh.

Within these meshes, the P type body region 6, the N$^+$ type of source region 7, and the P$^+$ type contact region 8 are formed to operate as a cell.

In this semiconductor device, the reliability of the gate is improved with suppression of increase in ON-resistance of the transistor from the desired value.

Fifth Embodiment

The semiconductor device according to the fifth embodiment has substantially the same structure as the semiconductor device in FIG. 11. The difference is that ends of a plurality of trenches 14 are connected each other at the gate lead wiring region 88.

Figure 12:
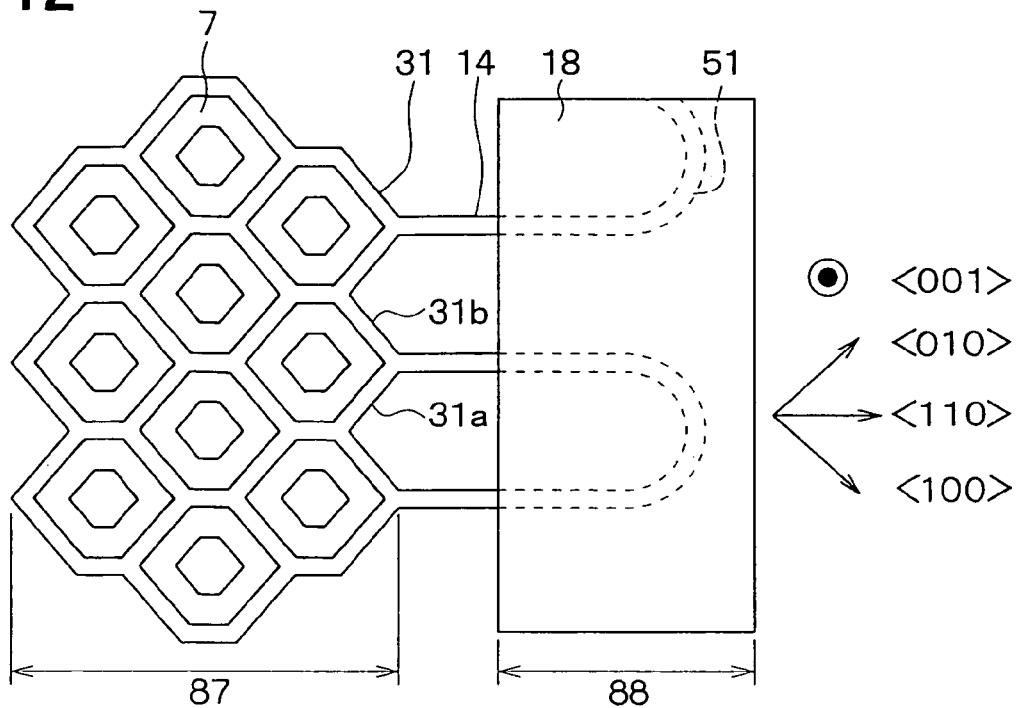
FIG. 12 is a plan view of the first example of semiconductor device according to the fifth embodiment of the present invention, the plan view showing a top view of a substrate for clarity.

As shown in FIG. 12, at the gate lead wiring region 88, two parallel trenches 14 extend and then curve such that they approach each other. Finally, they are connected each other at the gate lead wiring region 88.

In the case that the trench 14 terminates at the gate lead wiring region 88, as shown in FIG. 11, electric field is concentrated at the end of the trench 14. Therefore, a high electric field is generated locally, so that the gate oxide film may be destroyed. As a result, the gate withstand voltage will decrease.

On the other hand, in the semiconductor device according to this embodiment, two trenches 14 are connected each other at the curved connection portion 51. This structure suppresses a local high electric field. Accordingly, the gate reliability is improved in comparison of the device in FIG. 11.

Figure 13:
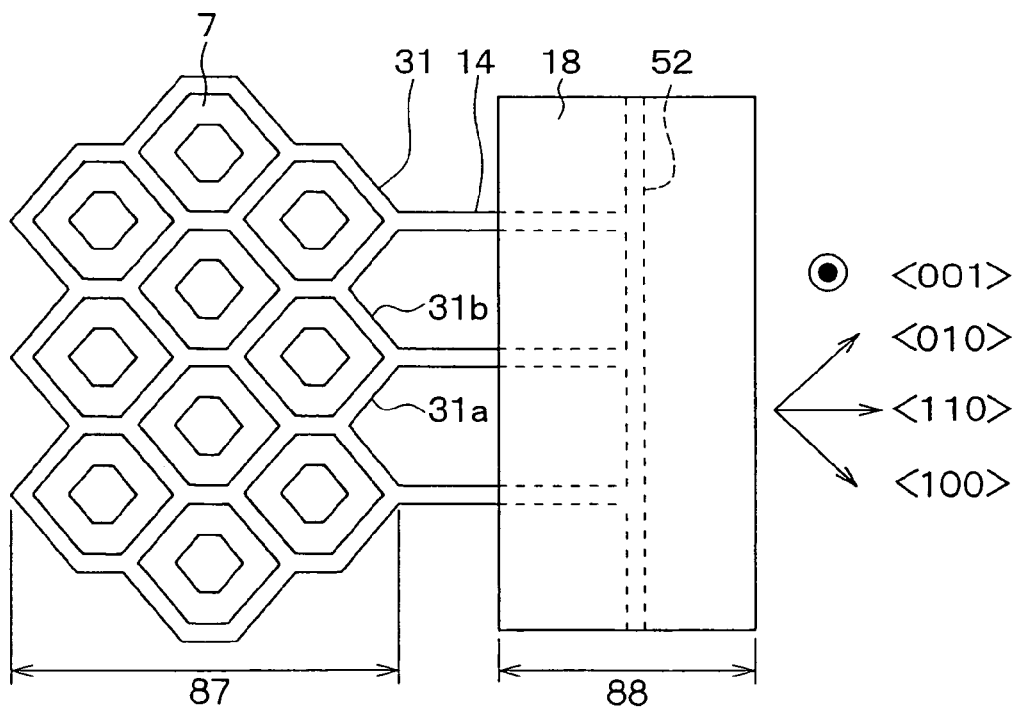
FIG. 13 is a plan view of the second example of semiconductor device according to the fifth embodiment, the plan view showing a top view of a substrate for clarity.

Although two trenches 14 are connected each other at the curved connection portion 51, another connection can be used. For example, as shown in FIG. 13, at the gate lead wiring region 88, a plurality of parallel trenches 14 extends and another trench 52 is connected to the parallel trenches 14. For example, three trenches 14 are connected to the trench 52. This structure suppresses a local high electric field. Accordingly, the gate reliability is improved.

Moreover, the sidewalls of the trench 52 are perpendicular to the <110> axis, i.e., the sidewalls of the trench 52 are the (110) and ($\bar{1}\bar{1}0$) planes, respectively. Thus, the gate oxide film on the trench 51 has a thickness thicker than the gate oxide film at the cell region 87, so that the gate reliability is improved.

Sixth Embodiment

Figure 14:
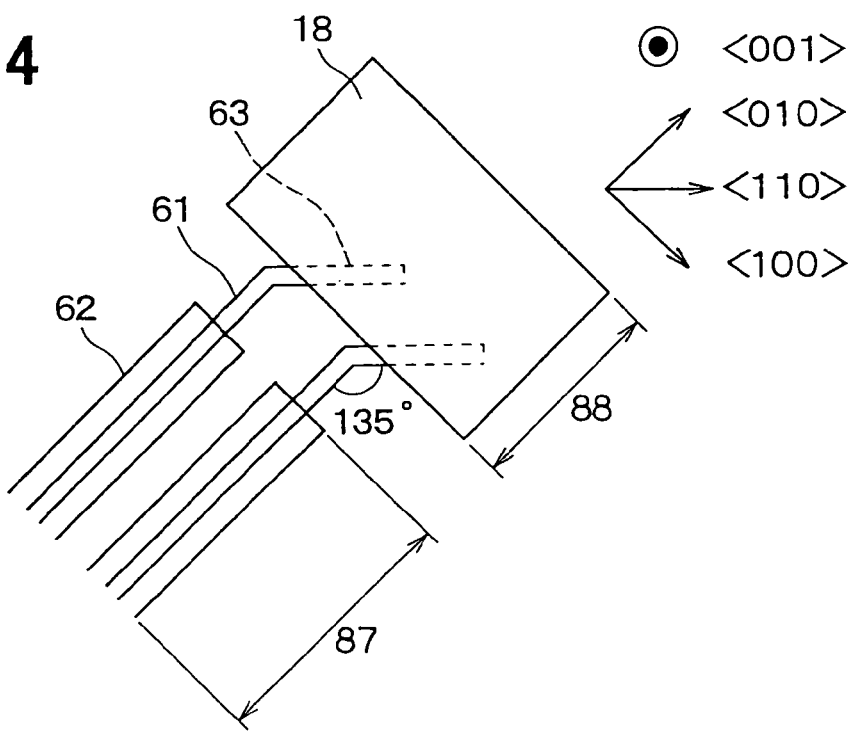
FIG. 14 is a plan view of the first example of semiconductor device according to the sixth embodiment of the present invention, the plan view showing a top view of a substrate for clarity.

As shown in FIG. 14, a semiconductor device according to the sixth embodiment has a stripe structure of trench at the cell region 87. At the cell region 87, a plurality of trenches 61 extend straightly along the <010> axis and reaches the gate lead wiring region 88. In other words, the sidewalls of the trench 61 are formed to have the (010)-oriented planes. In the surface layer of the semiconductor substrate 4, N$^+$ type of source regions 62 are formed at the both sides of each trench 61, i.e., the trench 61 is sandwiched between the N$^+$ type of source regions 62.

At the gate lead wiring region 88, trenches 63 extend along the <110> axis. In other words, the sidewalls of the trench 63 are the (110)-oriented planes. The trench 63 extends from the end of the trench 61 and makes an angle of 135° with the trench 61. The trenches 61, 63 are electrically connected together at the region between the cell region 87 and the gate lead wiring region 88.

The gate lead wiring pattern 18 is formed on the trench 63. The longitudinal direction of the gate lead wiring pattern 18 makes an angle of 45° with the <110> axis.

A method of forming the trenches 61 and 63 will be described as follows.

A mask is formed on the surface of the semiconductor substrate 4 in which the N$^-$ type drift layer 2, the P type base region 3, the P type well region 19, the P type body region 6, the N$^+$ type source region 62, and the P$^+$ type contact region 8 are successively formed on the N$^+$ type of semiconductor substrate 1 having Si (001) plane at its surface. Here, the N$^+$ type source regions 62 are formed to have strip patterns by etching with a mask.

At the cell-to-be-formed region, the trenches 61 are formed in a direction parallel to the <100> axis. Therefore, the sidewalls of the trench 61 are formed to have the (010) and ($0\bar{1}0$) planes, respectively.

At the gage-lead-wiring-to-be-formed region, for example, the trenches 63 are formed in a direction parallel to the <110> axis. Here, the trench 63 makes an angle of 135° with the trench 61. Therefore, the sidewalls of the trench 63 are formed to have the ($\bar{1}10$) and ($1\bar{1}0$) planes, respectively.

Next, the gate oxide films are formed on the trenches 61 and 63 by thermal oxidation. In this process, the thermal oxidation has plane-orientation dependency so that the gate oxide film in the trench 63 at the gate-lead-wiring-to-beformed region becomes thicker than the gate oxide film in the trench 61 at the cell-to-be-formed region. In other words, thermal oxidation speed of the gate oxide film of the trench 63 is greater than that of the trench 61.

Although the trench 63 is formed in the direction parallel to the <110> axis, the trench 63 can be formed in the direction perpendicular to the <110> axis.

Figure 15:
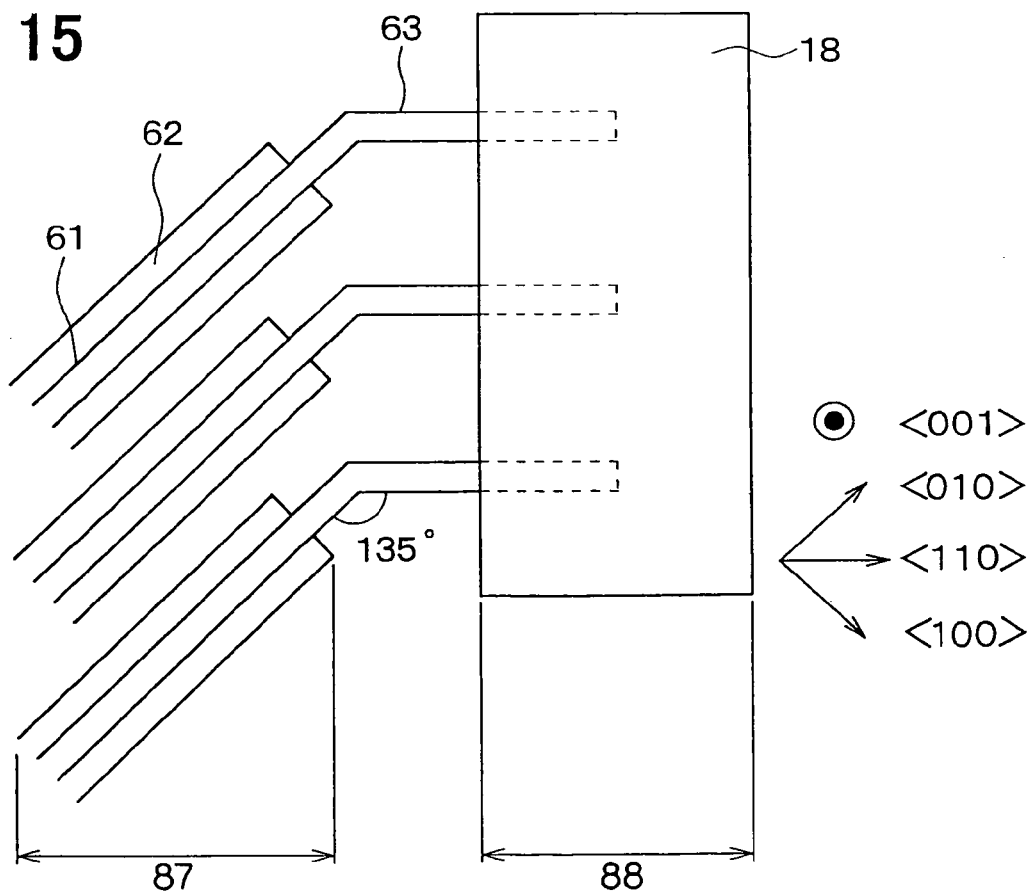
FIG. 15 is a plan view of the second example of semiconductor device according to the sixth embodiment, the plan view showing a top view of a substrate for clarity.

Moreover, the arrangement of the gate lead wiring pattern 18 can be modified. In this embodiment, as shown in FIG. 14, the longitudinal direction of the gate lead wiring pattern 18 extends parallel to the <100> axis, and the trench 61 at the cell region 87 extends perpendicularly to the longitudinal direction of the gate lead wiring pattern 18. However, the gate lead wiring pattern 18 can be formed such that the longitudinal direction thereof extends perpendicularly to the <110> axis, as shown in FIG. 15. In this arrangement, the trench 61 makes an angle of 135° with the trench 63 and extends in a direction making an angle of 45° with the longitudinal direction of the gate lead wiring pattern 18.

Seventh Embodiment

Figure 16:
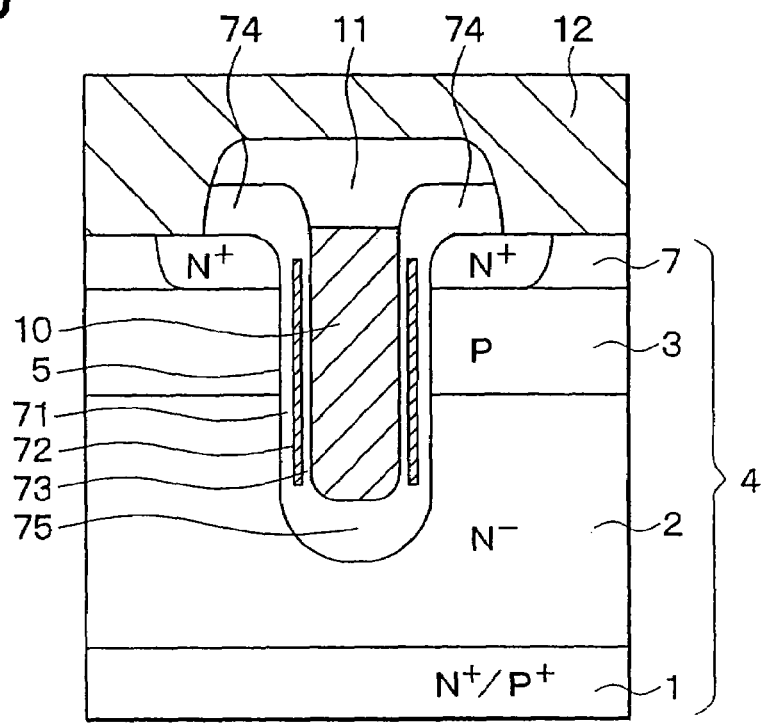
FIG. 16 is a plan view of a semiconductor device according to the seventh embodiment of the present invention, the plan view showing a top view of a substrate for clarity.

In this embodiment, ONO film (i.e., oxide-nitride-oxide film) is used as the gate oxide film. As shown in FIG. 16, a semiconductor device according to the seventh embodiment has a partial cross-sectional structure of the trench 5.

At the cell region 87, the trench 5 is formed along the <010> axis. That is, the sidewalls of the trench 5 have the (010)-oriented planes.

Figure 17:
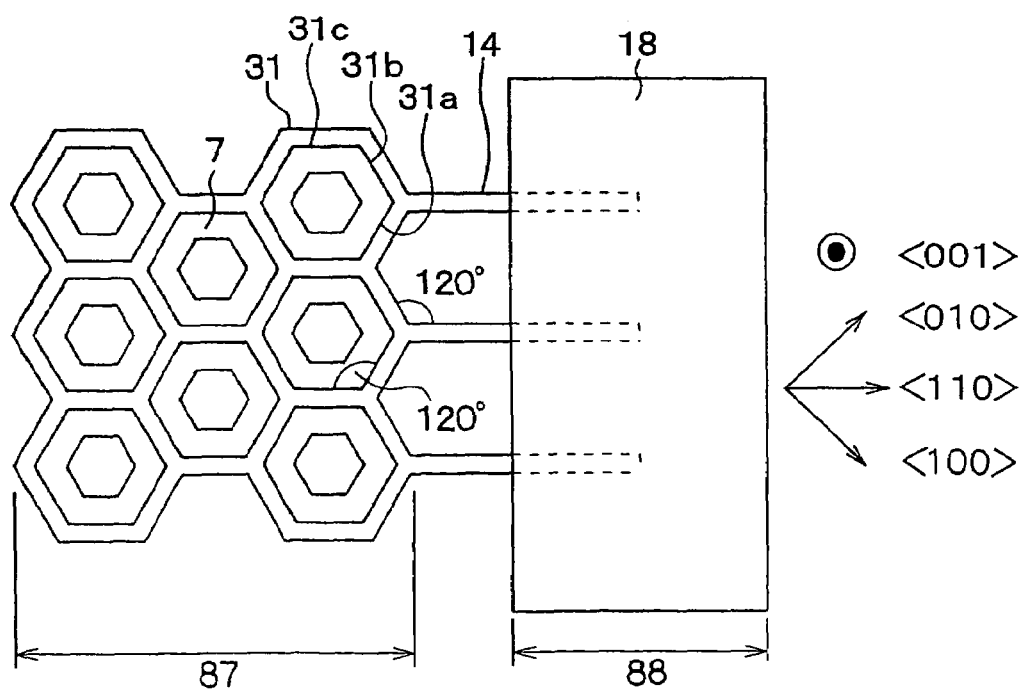
FIG. 17 is a plan view of an example of semiconductor device according to the eighth embodiment of the present invention, the plan view showing a top view of a substrate for clarity.

As shown in FIG. 17, on the sidewall of the trench 5, a silicon oxide film 71 having a thickness of 60 nm, a silicon nitrate film 72 having a thickness of about 8 nm-10 nm, and a silicon oxide film 73 having a thickness of about 6 nm-8 nm are laminated in this order, so that an ONO film is formed.

At the upper and lower sides of the trench 5, silicon oxide films 74 and 75 are formed. The silicon oxide film 75 has a thickness of 150 nm. The oxide film 74 has a thickness of 200 nm.

In this embodiment, a gate insulation film includes the ONO film formed on the sidewalls of the trench 5, the silicon oxide film 74 at the upper portion of the trench 5, and the silicon oxide film 75 at the bottom portion of the trench 5. Here, each thickness of the silicon oxide films 74 and 75 is thicker than that of the ONO film.

In the trench 5, the gate electrode 10 is formed on the silicon oxide films 73, 75. The layer-to-layer insulation film 11 is formed on the gate electrode 10 and the silicon oxide film 74. The silicon oxide film 74 is formed on the semiconductor substrate 4. Then, the metal electrode 12 is formed on the layer-to-layer insulation film 11.

The trench 14 at the gate lead wiring region 88 has the same structure as the trench 5 at the cell region 87. Here, the trench 14 is formed along the <110> axis. That is, the sidewalls of the trenches 14 are the (110)-oriented planes. The silicon oxide film 71 on the sidewalls of the trench 14 has a thickness of about 80 nm-100 nm, which is thicker than that of the silicon oxide film 71 of the trench 5 at the cell region 87.

Thus, the gate insulation films on the sidewalls of the trenches 5, 14 at the cell region 87 and the gate lead wiring region 88 include the ONO films, which provides a higher gate withstand voltage than the gate insulation film including only silicon oxide film in FIGS. 2 and 3. The silicon oxide film 71 formed in the trench 14 at the gate lead wiring region 88 is thicker than that at the cell region 87. This provides comparatively high gate reliability.

Moreover, the silicon oxide films 74, 75 formed at the upper and lower sides of the trenches 5, 14 at the cell region 87 and the gate lead wiring region 88, respectively, are thicker than that of the ONO films on the sidewalls of the trenches 5, 14. Further, the silicon oxide films 74, 75 are thicker than that of the gate insulation film 9 in FIGS. 2 and 3. Still further, the silicon oxide films 74, 75 are thicker than that of the ONO film. Thus, the gate reliability is improved. Moreover, the concentration of electric field at the upper corners of the trench 14 is reduced, so that the gate reliability is also improved. In general, when the gate oxide film is formed to have a uniform thickness, the electric field concentration at the upper and lower portions and the corner of the lower side of the trench 5 is easily occurred, so that the withstand voltage of the transistor is decreased. However, in this embodiment, the thickness of the gate insulation film is adaptively changed, i.e., the thickness thereof at the corner is increased, so that electric field locally applied to the gate oxide film at the corner is reduced. Therefore, the withstand voltage at the corner is limited to reduce, and the gate reliability is improved.

The method of producing the semiconductor device according to this embodiment is described as follows.

The oxide film 17 for a mask for trenches is deposited on the semiconductor substrate 4 and is patterned. Now, the trenches 5, 14 are formed at the cell-to-be-formed region and the gate-lead-wiring-to-be-formed region using the oxide film 17 as a mask. Next, the thermal oxidation provides the silicon oxide films 71 on the inner walls of the trenches 5 and 14 under the condition providing anisotropy in the oxidation speed.

In this process, the sidewall of the trench 5 at the cell region 87 is the (100)-oriented planes, and the sidewalls in the trenches 14 are the (110)-oriented planes. This structure results in that the silicon oxide film 71 at the gate lead region 88 is thicker than the silicon oxide film 71 at the cell region 87.

Next, the silicon nitride films 72 are formed on the surface of the semiconductor substrate 4 including the inner walls of the trenches 5 and 14 by LPCVD (low pressure chemical vapor deposition) method.

Subsequently, anisotropic dry etching with $CHF_3$ and $O_2$ gas system selectively removes the silicon nitride film 72. That is, leaves the silicon nitride films on the trenches 5, 14, and removes those on the bottom and upper portions of the trenches 5, 14 on the semiconductor substrate 4. This exposes the silicon oxide films 71 at the bottom and upper portions of the trenches 5, 14 and the surface of the semiconductor 43.

Now, thermal oxidation is carried out at, for example, 950° C. to form the silicon oxide film 73. During this process, at the bottom and upper portions of the trenches 5, 14 and the surface of the semiconductor substrate 4 where the silicon nitride films are removed, thickness of the silicon oxide film 71 becomes thicker, so that the silicon oxide films 75, 74 are formed.

The above process produces the gate insulation films including ONO films formed at the sidewalls of the trenches 5, 14 and silicon oxide films 74, 75 at both the cell region 87 and the gate lead wiring region 88.

Although the ONO films are formed on the trenches 5, 14 of the semiconductor device in FIG. 17, the ONO films can be formed on the trenches 5, 14 of the other semiconductor devices in FIGS. 1, 7, 8, and 12-16. Further, although gate insulation film is structured with the ONO film partially, the entire of the gate insulation film can be structured with the ONO films. In this case, the thickness of the gate insulation film at the cell region 87 is kept constant and at the gate lead wiring region 88 are increased to improve the withstand voltage.

Eighth Embodiment

The above semiconductor devices in FIGS. 1-17 have the silicon substrates with the (001) planes. In these cases, it is desirable to form the sidewalls of the trenches at the cell region 87 to have the (100)-oriented planes, and to form the sidewalls at the gate lead wiring region 88 to have the (110)-oriented planes in consideration of easiness in production. However, there are other possible structures capable of reducing the ON-resistance of the transistor as long as the speed of thermal oxidation at the sidewalls of the trenches at the gate lead wiring region 88 is greater than that at the cell region 87. That is, other crystal planes can be used for the sidewalls of the trenches at the cell region 87 and at the gate lead wiring region 88.

The semiconductor device according to the eighth embodiment is shown in FIG. 17. The semiconductor device has a hexagon mesh structure. All of internal angles of each hexagon are equal to 120°. In FIG. 17, the trench sides 31$a$, 31$b$, 31$c$ make angles of 120° with the neighbor trench sides. The trench sides 31$a$, 31$b$ extend in the directions making an angle of 120° with the <110> axis, and the trench side 31$c$ extends in the direction parallel to the <110> axis.

Therefore, four trench sides 31$a$, 31$b$ of the hexagon at each mesh have crystal planes making an angle of 120° with the <110> axis. The speed of thermal oxidation at these crystal planes is smaller that that at the crystal plane (110). Thus, the oxide films on the sidewalls of the trench sides 31$a$, 31$b$ are thinner than the oxide film on the sidewalls of the trenches 14 at the gate lead wiring region 88. Here, the oxide film on the sidewalls of the trench side 31$c$ is the same thickness as the oxide film on the sidewalls of the trenches 14 at the gate lead wiring region 88. This structure improves the gate withstand voltage with suppression of increase in the ON-resistance of the transistor from the desired value.

Moreover, as long as a crystal plane of which the atomic surface density is relatively high and the speed of thermal oxidation is relatively high like the (110) plane, other crystal planes such as the (111) plane can be used as the sidewalls of the trenches 14 at the gate lead wiring region 88.

Ninth Embodiment

A semiconductor device according to the ninth embodiment of the present invention has a silicon substrate of which surface is a plane other than the (001)-oriented plane. In this case, the trenches 5, 14 is formed in such a manner that the speed of thermal oxidation of the sidewalls of the trench 14 at the gate lead wiring region 88 is greater than that at the cell region 87.

A plurality of semiconductor devices with silicon substrates having the (0$\bar{1}$1) planes is shown in FIGS. 19-25.

Figure 18:
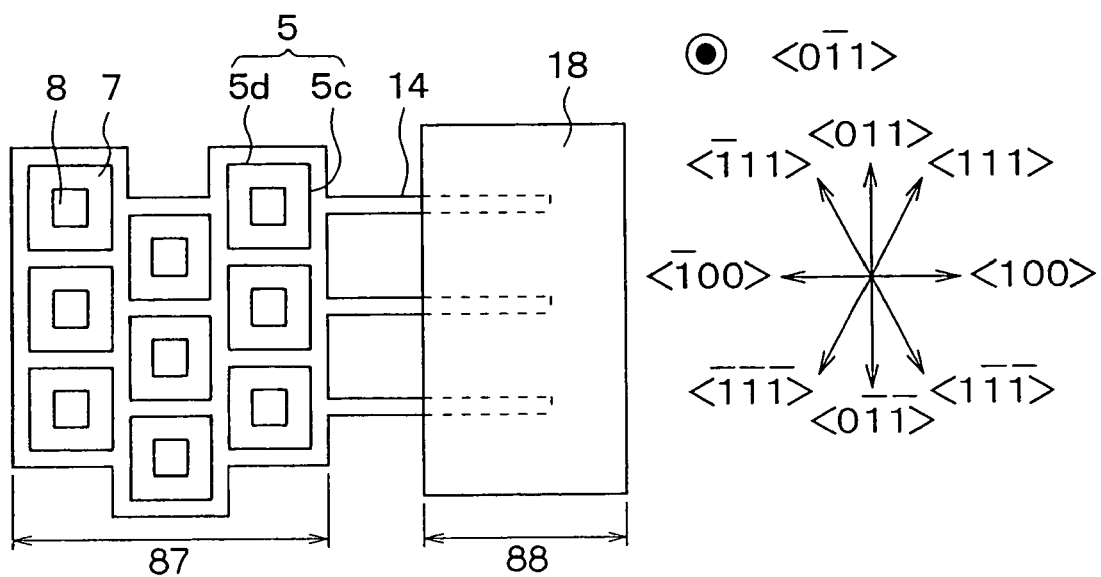
FIG. 18 is a plan view of the first example of semiconductor device according to the ninth embodiment of the present invention, the plan view showing a top view of a substrate for clarity.

For example, as shown in FIG. 18, the surface configuration of a cell in mesh structure is a quadrangle. The surface pattern shown in FIG. 18 is substantially the same as that in FIG. 25. However, trench sides 5$c$ extend along the <100> axis, and the trench sides 5$d$ extend along the <011> axis. The trench side 5$c$ has the same length as the trench side 5$d$. The trenches 14 at the gate lead wiring region 88 extend along the <100> axis.

In this example, at the cell region 87, two trench sides 5$c$ extend along the <011> axis, and the trenches 14 at the gate lead wiring region 88 have the (011)-oriented plane. Therefore, this structure improves the gate withstand voltage with suppression of increase in the ON-resistance of the transistor.

Figure 20:
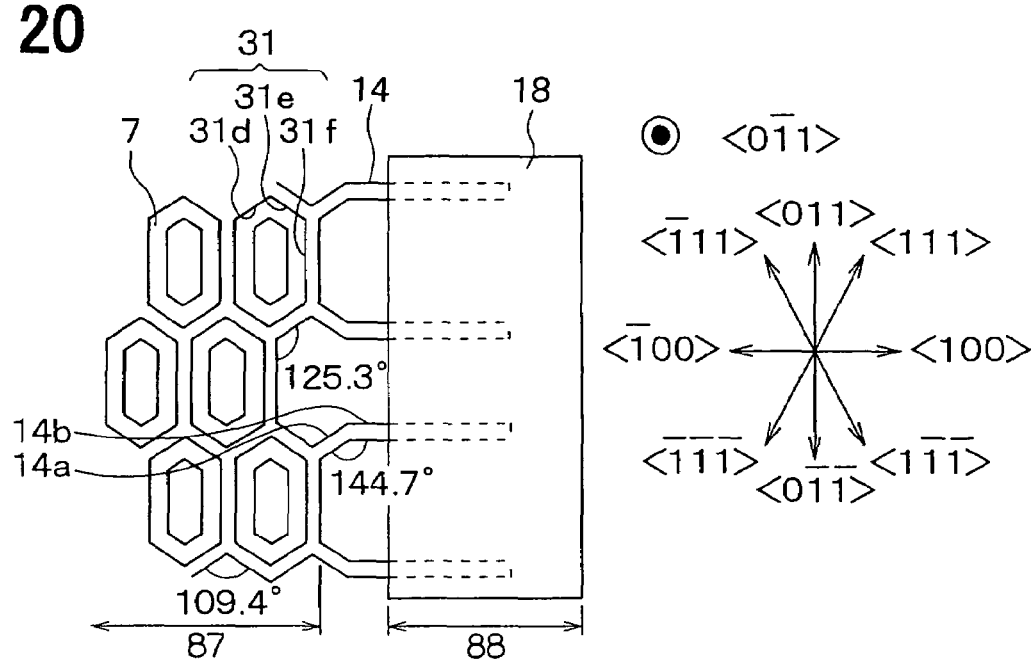
FIG. 20 is a plan view of the third example of semiconductor device according to the ninth embodiment, the plan view showing a top view of a substrate for clarity.
Figure 21:
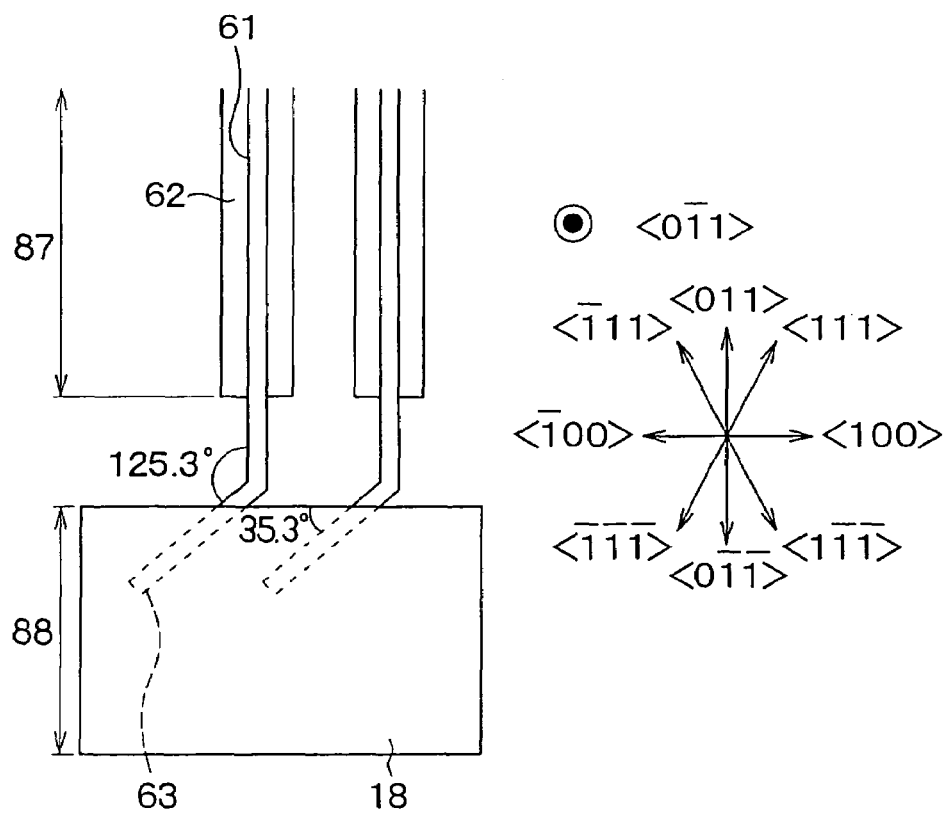
FIG. 21 is a plan view of the fourth example of semiconductor device according to the ninth embodiment, the plan view showing a top view of a substrate for clarity.

In FIGS. 20 and 21, a cell of a mesh structure is a hexagon.

Figure 19:
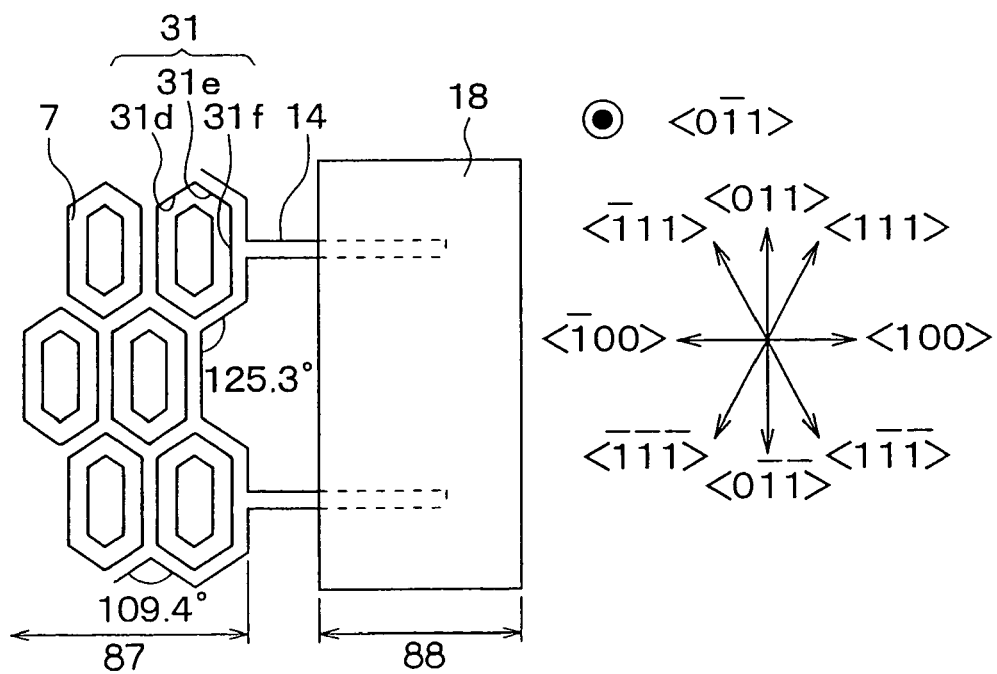
FIG. 19 is a plan view of the second example of semiconductor device according to the ninth embodiment, the plan view showing a top view of a substrate for clarity.

As shown in FIG. 19, at the cell region 87, each trench side 31$d$ extends perpendicularly to the <$\bar{1}$11> axis, and each trench side 31$e$ extends perpendicularly to the <111> axis. In other words, both trench sides 31$d$, 31$e$ have the (111)-oriented planes. The trench side 31$f$ extends perpendicularly to the <100> axis. Therefore, the trench side 31$f$ has the (100)-oriented planes. Here, the trench side 31$f$ makes an angle of 125.3° with the trench side 31$d$, and the trench side 31$d$ makes an angle of 109.4° with the trench side 31$e$.

On the other hand, at the gate lead wiring region 88, the trench 14 extends perpendicularly to the <011> axis and thus, the sidewalls of the trenches 14 have the (011)-oriented planes.

The length of the trench side 31$f$ is longer than the total length of two trench sides 31$d$, 31$e$. Therefore, the total length of two of the trench side 31$f$ in each cell is longer than a half of the total length of all trench sides 31$d$-31$f$. As a result, this structure improves the gate withstand voltage with suppression of increase in the ON-resistance.

In FIG. 19, the trench 14 is connected to the trench side 31$f$ perpendicularly. However, the structure shown in FIG. 20 in which the trench 14 is connected to the trench side 31$f$ at another angle can be also useful. In FIG. 20, a trench side 14$a$ extends parallel to the trench side 31$d$ from one end of the trench side 31$f$ so as to have a predetermined length and is connected to a trench side 14$b$. The trench side 14$a$ makes an angle of 144.7° with the trench side 14$b$.

There is another example in which sidewalls of trenches at the cell region 87 are mainly the (100)-oriented planes and sidewalls of trenches at the gate lead wiring region 88 are mainly the (111)-oriented planes.

For example, as shown in FIG. 21, trench gates have strip structure. At the cell region 87, the trench 61 extends in a direction perpendicular to the <100> axis, so that the sidewalls of the trench 61 have the (100)-oriented planes. On the other hand, at the gate lead wiring region 88, the trench 63 extends perpendicularly to the <$\bar{1}$11> axis, so that the sidewalls of the trench 63 have the (111)-oriented planes.

In this arrangement, the trench 61 makes an angle of 125.3° with the trench 63. The longitudinal direction of gate lead wiring pattern 18 extends parallel to the <100> axis and makes an angle of 35.3° with the trench 63. This arrangement improves the gate withstand voltage with suppression of increase in the ON-resistance.

Figure 23:
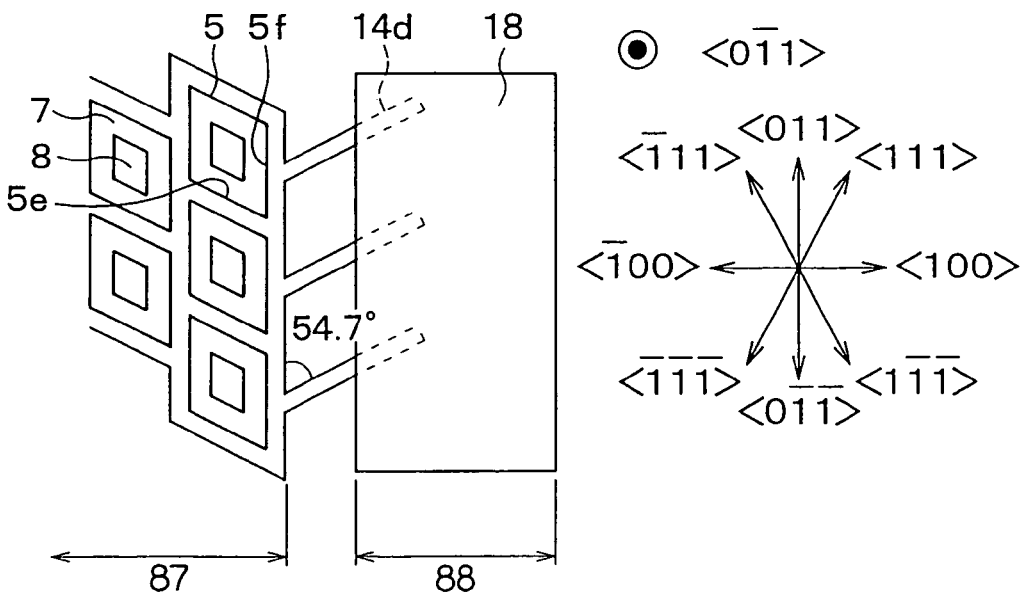
FIG. 23 is a plan view of the sixth example of semiconductor device according to the ninth embodiment, the plan view showing a top view of a substrate for clarity.
Figure 24:
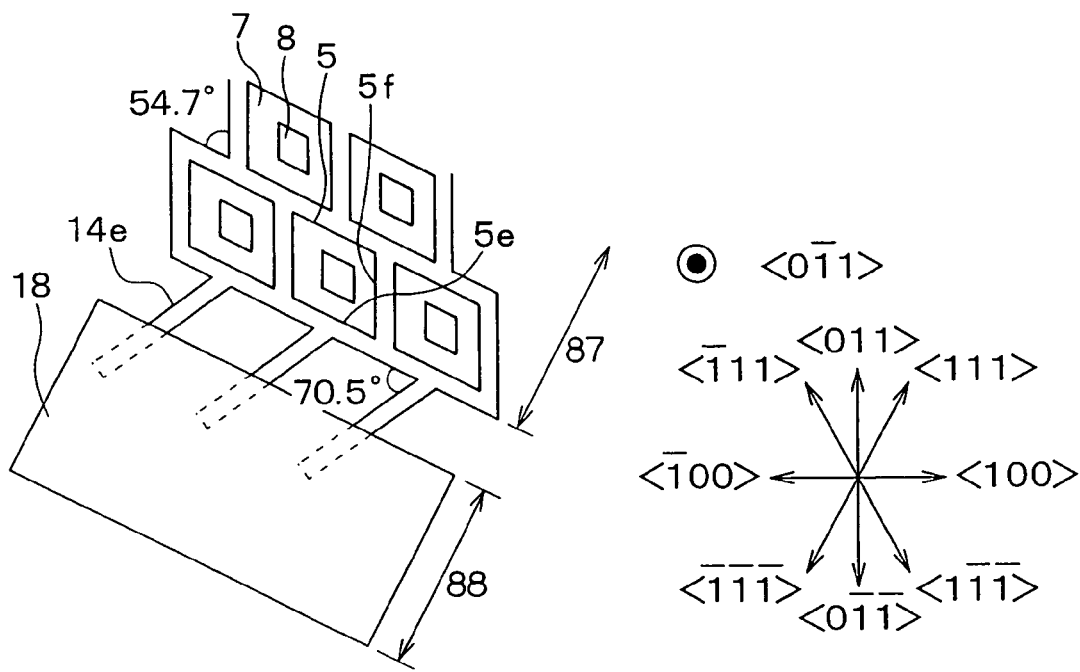
FIG. 24 is a plan view of the seventh example of semiconductor device according to the ninth embodiment, the plan view showing a top view of a substrate for clarity.
Figure 25:
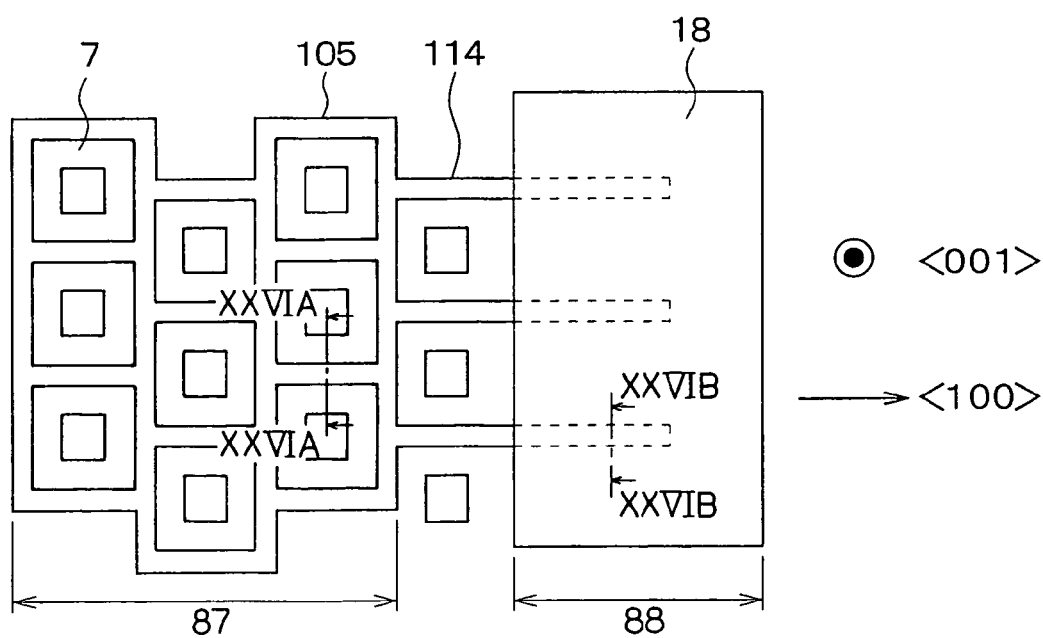
FIG. 25 is a plan view of a semiconductor device according to a related art, the plan view showing a top view of a substrate on arrow XXV-XXV in FIG. 26A for clarity.
Figure 26A:
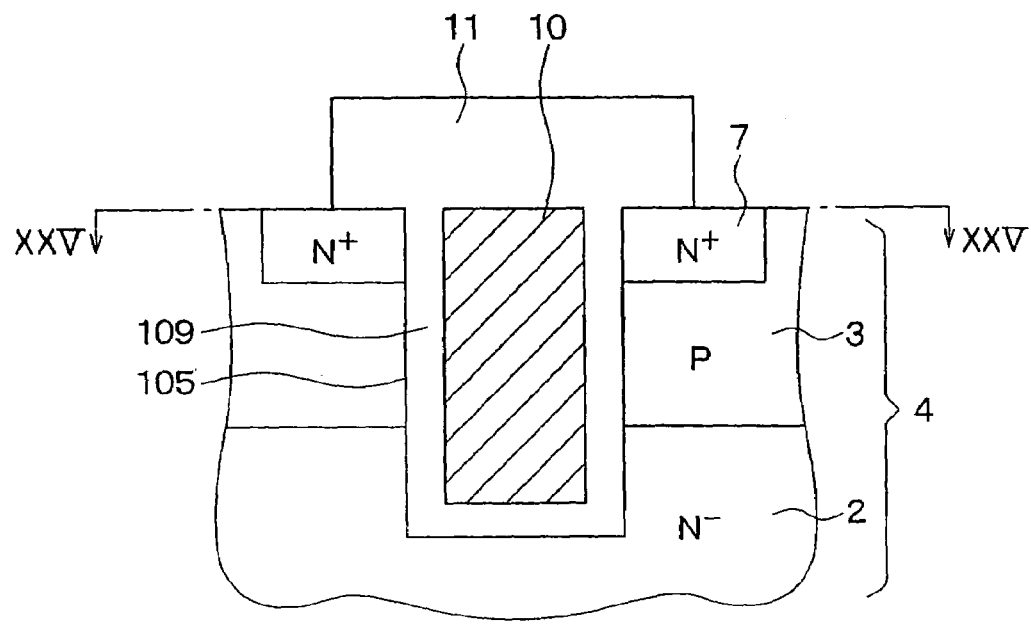
FIG. 26A is a partial enlarged cross-sectional view taken along line XXVIA-XXVIA in FIG. 25
Figure 26B:
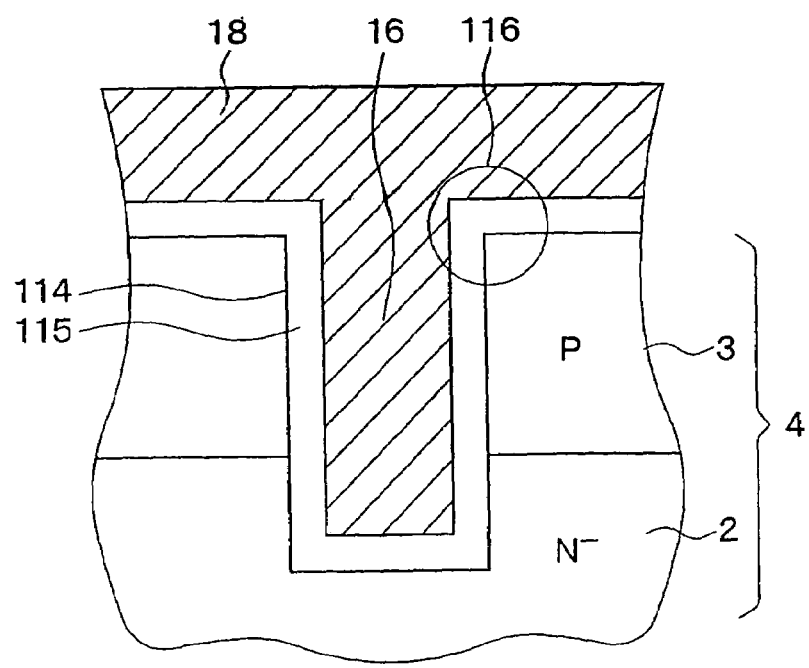
FIG. 26B is a partial enlarged cross-sectional view taken along line XXVIB-XXVIB in FIG. 25.

Semiconductor devices in FIGS. 23-25 have the mesh structure with a quadrangle mesh.

Figure 22:
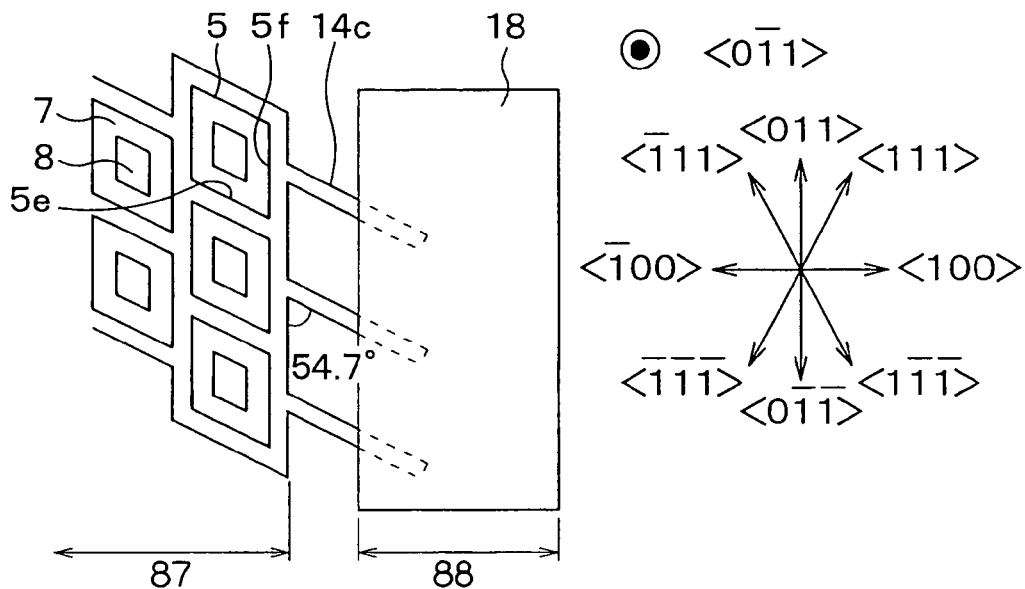
FIG. 22 is a plan view of the fifth example of semiconductor device according to the ninth embodiment, the plan view showing a top view of a substrate for clarity.

As shown in FIG. 22, at the cell region 87, a trench side 5$e$ extends perpendicularly to the <111> axis. Therefore, the sidewalls of the trench side 5$e$ have the (111)-oriented planes, i.e., the (111) and ($\bar{1}$ $\bar{1}$ $\bar{1}$) planes. A trench side 5$f$ extends perpendicularly to the <100> axis. Therefore, the sidewalls of the trench side 5$f$ have the (100)-oriented planes. The trench side 14$c$ is connected to the trench side 5$f$ and makes an angle of 54.7° with the trench side 5$f$. The longitudinal direction of the gate lead wiring pattern 18 extends perpendicularly to the <100> axis and makes an angle of 54.7° with the trench side 14$c$.

In this arrangement, because the trench side 5$e$ has the same length as the trench side 5$f$, so that a half of all the sidewalls of the trench sides have the (100)-oriented planes. Accordingly, this configuration improves the gate withstand voltage with suppression of increase in the ON-resistance.

In FIG. 22, the trench side 14c extends perpendicularly to the <111> axis at the gate lead wiring region 88. However, as shown in FIG. 23, trench sides 14d extending perpendicularly to the <1̄11> axis can be arranged instead of the trench side 14c. In this case, the trench side 14d makes an angle of 54.7° with trench side 5f. Therefore, the sidewalls of the trench sides 14d have the (111)-oriented planes, i.e., the (1̄11) and (11̄1̄) planes.

A modified arrangement of the semiconductor device is shown in FIG. 24. In the structure shown in FIG. 24, the gate lead wiring pattern 18 extends in a direction that makes an angle of 35.3° with the <1̄00> axis. Trench sides 14e extend perpendicularly to the <1̄11> axis, so that the sidewalls of the trench sides 14e have the (111)-oriented planes. The trench side 14e is connected to the trench side 5e with an angle of 70.5° and makes an angle of 70.5° with the gate lead wiring pattern 18. This structure also provides to improve the gate withstand voltage with suppression of increase in the ON-resistance.

Modifications

In the above embodiments, the semiconductor device includes the N channel type MOSFET having trench gates. However, a P channel type MOSFET, in which the conduction type is inverted, and power elements having MOS structure with trench gates, such as IGBT in which the conduction types of the substrate 1 and the drift layer are different from each other, can be used instead of the N channel type MOSFET.

Such changes and modifications are to be understood as being within the scope of the present invention as defined by the appended claims.

What is claimed is:

1. A method of producing a semiconductor device, comprising the steps of:
    forming a trench in a surface portion of a semiconductor substrate so as to extend from a cell-to-be-formed region for forming a cell for operating as a transistor to a gate-lead-wiring-to-be-formed region;
    forming an oxide film on an inner surface of the trench so as to have sidewalls and a bottom wall by thermal oxidation; and
    forming a gate electrode in the trench insulated with at least the oxide film from the substrate,
    wherein
    in the step of forming the trench, the trench is formed to have crystal planes of a first main portion of the sidewalls of the trench at the cell-to-be-formed region and a second main portion of the sidewalls of the trench at the gate-lead-wiring-to-be-formed region in such a manner that a first speed of forming the oxide film at the cell-to-be-formed region is smaller than a second speed of forming the oxide film at the gate-lead-wiring-to-be-formed region,
    in the step of forming the oxide film, the thermal oxidation is performed so as to make a first thickness of the oxide film on the inner surface of the trench at the cell-to-be-formed region thinner than a second thickness of the oxide film on the inner surface of the trench at the gate-lead-wiring-to-be-formed region,
    the trench at the cell-to-be-formed region provides a quadrangle cell, and
    a plurality of cells is arranged on the surface of the semiconductor substrate like a net pattern at the cell region.

2. A method of producing a semiconductor device, comprising the steps of:
    forming a trench in a surface portion of a semiconductor substrate so as to extend from a cell-to-be-formed region for forming a cell for operating as a transistor to a gate-lead-wiring-to-be-formed region;
    forming an oxide film on an inner surface of the trench so as to have sidewalls and a bottom wall by thermal oxidation; and
    forming a gate electrode in the trench insulated with at least the oxide film from the substrate,
    wherein,
    in the step of forming the trench, the trench is formed to have crystal planes of a first main portion of the sidewalls of the trench at the cell-to-be-formed region and a second main portion of the sidewalls of the trench at the gate-lead-wiring-to-be-formed region in such a manner that a first speed of forming the oxide film at the cell-to-be-formed region is smaller than a second speed of forming the oxide film at the gate-lead-wiring-to-be-formed region,
    in the step of forming the oxide film, the thermal oxidation is performed so as to make a first thickness of the oxide film on the inner surface of the trench at the cell-to-be-formed region thinner than a second thickness of the oxide film on the inner surface of the trench at the gate-lead-wiring-to-be-formed region,
    the trench at the cell-to-be-formed region provides a hexagon cell, and
    a plurality of cells is arranged on the surface of the semiconductor substrate like a net pattern at the cell region.

3. A method of producing a semiconductor device, comprising the steps of:
    forming a trench in a surface portion of a semiconductor substrate so as to extend from a cell-to-be-formed region for forming a cell for operating as a transistor to a gate-lead-wiring-to-be-formed region;
    forming an oxide film on an inner surface of the trench so as to have sidewalls and a bottom wall by thermal oxidation; and
    forming a gate electrode in the trench insulated with at least the oxide film from the substrate,
    wherein
    in the step of forming the trench, the trench is formed to have crystal planes of a first main portion of the sidewalls of the trench at the cell-to-be-formed region and a second main portion of the sidewalls of the trench at the gate-lead-wiring-to-be-formed region in such a manner that a first speed of forming the oxide film at the cell-to-be-formed region is smaller than a second speed of forming the oxide film at the gate-lead-wiring-to-be-formed region,
    in the step of forming the oxide film, the thermal oxidation is performed so as to make a first thickness of the oxide film on the inner surface of the trench at the cell-to-be-formed region thinner than a second thickness of the oxide film on the inner surface of the trench at the gate-lead-wiring-to-be-formed region,
    the trench at the cell-to-be-formed region provides an octagon cell as a first cell and a quadrangle cell as a second cell, and
    a plurality of first and second cells is alternately arranged on the surface of the semiconductor substrate like a net pattern at the cell region.

4. A method of producing a semiconductor device, comprising the steps of:

forming a trench in a surface portion of a semiconductor substrate so as to extend from a cell-to-be-formed region for forming a cell for operating as a transistor to a gate-lead-wiring-to-be-formed region;

forming an oxide film on an inner surface of the trench so as to have sidewalls and a bottom wall by thermal oxidation; and forming a gate electrode in the trench insulated with at least the oxide film from the substrate, wherein in the step of forming the trench, the trench is formed to have crystal planes of a first main portion of the sidewalls of the trench at the cell-to-be-formed region and a second main portion of the sidewalls of the trench at the gate-lead-wiring-to-be-formed region in such a manner that a first speed of forming the oxide film at the cell-to-be-formed region is smaller than a second speed of forming the oxide film at the gate-lead-wiring-to-be-formed region, in the step of forming the oxide film, the thermal oxidation is performed so as to make a first thickness of the oxide film on the inner surface of the trench at the cell-to-be-formed region thinner than a second thickness of the oxide film on the inner surface of the trench at the gate-lead-wiring-to-be-formed region, the substrate includes a silicon substrate having a (100) crystal plane, the first main portion of the sidewalls of the trench at the cell-to-be-formed region has the (100) crystal plane, the second main portion of the sidewalls of the trench at the gate-lead-wiring-to-be-formed region has a (110) crystal plane, and in the step of forming the oxide film, the thermal oxidation is performed at a temperature between 850° C. and 1000° C.

\* \* \* \* \*